(12) United States Patent
Matsumoto

(10) Patent No.: US 12,027,557 B2
(45) Date of Patent: Jul. 2, 2024

(54) SEMICONDUCTOR ELEMENT AND METHOD OF MANUFACTURING THE SAME

(71) Applicant: SONY SEMICONDUCTOR SOLUTIONS CORPORATION, Kanagawa (JP)

(72) Inventor: Ryosuke Matsumoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 561 days.

(21) Appl. No.: 17/283,675

(22) PCT Filed: Oct. 3, 2019

(86) PCT No.: PCT/JP2019/039139
§ 371 (c)(1),
(2) Date: Apr. 8, 2021

(87) PCT Pub. No.: WO2020/080124
PCT Pub. Date: Apr. 23, 2020

(65) Prior Publication Data
US 2021/0384246 A1 Dec. 9, 2021

(30) Foreign Application Priority Data
Oct. 16, 2018 (JP) .................................. 2018-195110

(51) Int. Cl.
*H01L 27/146* (2006.01)
(52) U.S. Cl.
CPC .... *H01L 27/14634* (2013.01); *H01L 27/1462* (2013.01); *H01L 27/14636* (2013.01); *H01L 27/1469* (2013.01)

(58) Field of Classification Search
CPC ........... H01L 27/14634; H01L 27/1462; H01L 27/14636; H01L 27/1469; H01L 27/14687; H01L 27/14694; H01L 27/1465
See application file for complete search history.

(56) References Cited

U.S. PATENT DOCUMENTS

2008/0308888 A1  12/2008  Lee
2009/0065824 A1   3/2009  Hwang
(Continued)

FOREIGN PATENT DOCUMENTS

CN    101325206 A    12/2008
CN    101383364 A     3/2009
(Continued)

OTHER PUBLICATIONS

International Search Report and Written Opinion of PCT Application No. PCT/JP2019/039139, dated Dec. 24, 2019, 11 pages of ISRWO.

(Continued)

*Primary Examiner* — Elias Ullah
(74) *Attorney, Agent, or Firm* — CHIP LAW GROUP

(57) ABSTRACT

A semiconductor element including: an element substrate provided with an element region at a middle part and a peripheral region outside the element region; and a readout circuit substrate facing the element substrate, in which the element substrate includes a first semiconductor layer provided in the element region and including a compound semiconductor material, a wiring layer provided between the first semiconductor layer and the readout circuit substrate, the wiring layer electrically coupling the first semiconductor layer and the readout circuit substrate to each other, a first passivation film provided between the wiring layer and the first semiconductor layer, and a second passivation film opposed to the first passivation film with the first semiconductor layer interposed therebetween, and in which the (Continued)

peripheral region of the element substrate includes a bonded surface with respect to the readout circuit substrate.

15 Claims, 33 Drawing Sheets

(56) References Cited

U.S. PATENT DOCUMENTS

| | | |
|---|---|---|
| 2011/0157445 A1 | 6/2011 | Itonaga et al. |
| 2012/0153419 A1 | 6/2012 | Itonaga et al. |
| 2013/0256824 A1 | 10/2013 | Mizuta et al. |
| 2013/0285186 A1 | 10/2013 | Itonaga et al. |
| 2014/0217542 A1 | 8/2014 | Itonaga et al. |
| 2016/0254299 A1 | 9/2016 | Gomi |
| 2018/0012924 A1* | 1/2018 | Umebayashi ....... H01L 27/1469 |
| 2018/0019279 A1 | 1/2018 | Itonaga et al. |
| 2019/0027528 A1 | 1/2019 | Yoshida |
| 2019/0074319 A1 | 3/2019 | Itonaga et al. |
| 2019/0157324 A1 | 5/2019 | Watanabe et al. |
| 2019/0198547 A1 | 6/2019 | Yoshigiwa |
| 2020/0127039 A1 | 4/2020 | Saito |

FOREIGN PATENT DOCUMENTS

| | | |
|---|---|---|
| CN | 102110700 A | 6/2011 |
| CN | 103646953 A | 3/2014 |
| CN | 108475688 A | 8/2018 |
| CN | 109314124 A | 2/2019 |
| CN | 109690779 A | 4/2019 |
| CN | 110226228 A | 9/2019 |
| DE | 102008046036 A1 | 4/2009 |
| EP | 3404715 A1 | 11/2018 |
| EP | 3490001 A1 | 5/2019 |
| EP | 3509105 A1 | 7/2019 |
| IN | 103367374 A | 10/2013 |
| JP | 2009-065163 A | 3/2009 |
| JP | 2011-151375 A | 8/2011 |
| JP | 2013-135123 A | 7/2013 |
| JP | 2014-521216 A | 8/2014 |
| JP | 5664205 B2 | 2/2015 |
| JP | 2015-115420 A | 6/2015 |
| JP | 2017-126738 A | 7/2017 |
| JP | 2018-037611 A | 3/2018 |
| JP | 6903896 B2 | 7/2021 |
| KR | 10-2008-0109134 A | 12/2008 |
| KR | 10-0882979 B1 | 2/2009 |
| KR | 10-2011-0074666 A | 7/2011 |
| KR | 10-2019-0028376 A | 3/2019 |
| KR | 10-2019-0041490 A | 4/2019 |
| TW | 200915558 A | 4/2009 |
| TW | 201126707 A | 8/2011 |
| TW | 201403805 A | 1/2014 |
| TW | 201841354 A | 11/2018 |
| WO | 2015/087918 A1 | 6/2015 |
| WO | WO-2016017350 A1 | 2/2016 |
| WO | 2017/122537 A1 | 7/2017 |
| WO | 2018/016181 A1 | 1/2018 |
| WO | 2018/042886 A1 | 3/2018 |
| WO | 2018/139110 A1 | 8/2018 |

OTHER PUBLICATIONS

Extended European Search Report of EP Application No. 19872520.2, dated Dec. 8, 2021, 10 pages.

* cited by examiner

SEMICONDUCTOR ELEMENT AND METHOD OF MANUFACTURING THE SAME

CROSS REFERENCE TO RELATED APPLICATIONS

This application is a U.S. National Phase of International Patent Application No. PCT/JP2019/039139 filed on Oct. 3, 2019, which claims priority benefit of Japanese Patent Application No. JP 2018-195110 filed in the Japan Patent Office on Oct. 16, 2018. Each of the above-referenced applications is hereby incorporated herein by reference in its entirety.

TECHNICAL FIELD

The present disclosure relates to a semiconductor element used in, for example, an infrared sensor or the like, and a method of manufacturing the semiconductor element.

BACKGROUND ART

In recent years, an image sensor (an infrared sensor) sensitive to an infrared region has been commercialized. For example, as described in PTL 1, in a semiconductor element used in the infrared sensor, for example, a photoelectric conversion layer including a group III-V semiconductor such as InGaAs (indium gallium arsenide) is used, thus allowing infrared rays to be absorbed in the photoelectric conversion layer to thereby generate charges (photoelectric conversion is performed).

CITATION LIST

Patent Literature

PTL 1: Japanese Unexamined Patent Application Publication (Published Japanese Translation of PCT Application) No. JP2014-521216

SUMMARY OF THE INVENTION

There is a possibility, in such a semiconductor element, that a compound semiconductor material such as a group III-V semiconductor material may be influenced by, for example, moisture or the like from the outside, which may lower reliability.

It is therefore desirable to provide a semiconductor element that makes it possible to protect a compound semiconductor material and thus to suppress lowering in reliability, and a method of manufacturing the semiconductor element.

A semiconductor element according to an embodiment of the present disclosure includes: an element substrate provided with an element region at a middle part and a peripheral region outside the element region; and a readout circuit substrate facing the element substrate, in which the element substrate includes a first semiconductor layer provided in the element region and including a compound semiconductor material, a wiring layer provided between the first semiconductor layer and the readout circuit substrate, the wiring layer electrically coupling the first semiconductor layer and the readout circuit substrate to each other, a first passivation film provided between the wiring layer and the first semiconductor layer, and a second passivation film opposed to the first passivation film with the first semiconductor layer interposed therebetween, and in which the peripheral region of the element substrate includes a bonded surface with respect to the readout circuit substrate.

In the semiconductor element according to an embodiment of the present disclosure, the first semiconductor layer is provided between the first passivation film and the second passivation film, and thus at least the first semiconductor layer is protected from sides of both surfaces (a surface on side of the wiring layer and a surface on side opposite to the wiring layer).

A method of manufacturing a semiconductor element according to an embodiment of the present disclosure includes: forming a semiconductor layer including a compound semiconductor material; bonding the semiconductor layer to a temporary substrate; forming a first passivation film covering the semiconductor layer after the bonding of the semiconductor layer to the temporary substrate; forming an embedded layer that fills a step difference between the semiconductor layer and the temporary substrate; forming a wiring layer over a surface opposite to a bonded surface of the semiconductor layer with respect to the temporary substrate; causing a readout circuit substrate to be opposed to the semiconductor layer with the wiring layer interposed therebetween to electrically couple the semiconductor layer and the readout circuit substrate to each other via the wiring layer; and forming a second passivation film opposed to the first passivation film with the semiconductor layer interposed therebetween after removal of the temporary substrate bonded to the semiconductor layer.

In the method of manufacturing the semiconductor element according to an embodiment of the present disclosure, the first passivation film and the second passivation film opposed to each other with the first semiconductor layer in between are formed, and thus at least the first semiconductor layer is protected from sides of both surfaces (a surface on side of the wiring layer and a surface on side opposite to the wiring layer).

It is to be noted that the above-described content is an example of the present disclosure. The effects of the present disclosure are not limited to those described above, and may be other different effects or may further include other effects.

MODES FOR CARRYING OUT THE INVENTION

Hereinafter, description is given in detail of an embodiment of the present disclosure with reference to the drawings. It is to be noted that the description is given in the following order.
1. First embodiment (An example of a light-receiving element including a first passivation film and a second passivation film)
2. Modification Example 1 (An example in which a first passivation film covers a semiconductor layer with a first electrode interposed therebetween)
3. Modification Example 2 (An example in which a first embedded layer and a second embedded layer are provided)
4. Modification Example 3 (An example in which a color filter and an on-chip lens are provided)
4. Second embodiment (An example of a light-receiving element in which a semiconductor layer including silicon is stacked over an element substrate)
5. Application Example 1 (An example of an imaging element)
6. Applicable Example 2 (An example of an electronic apparatus)
7. Practical Application Example 1 (Example of Practical Application to Endoscopic Surgery System)
8. Practical Application Example 2 (Example of Practical Application to Mobile Body)

First Embodiment

Figure 1A:
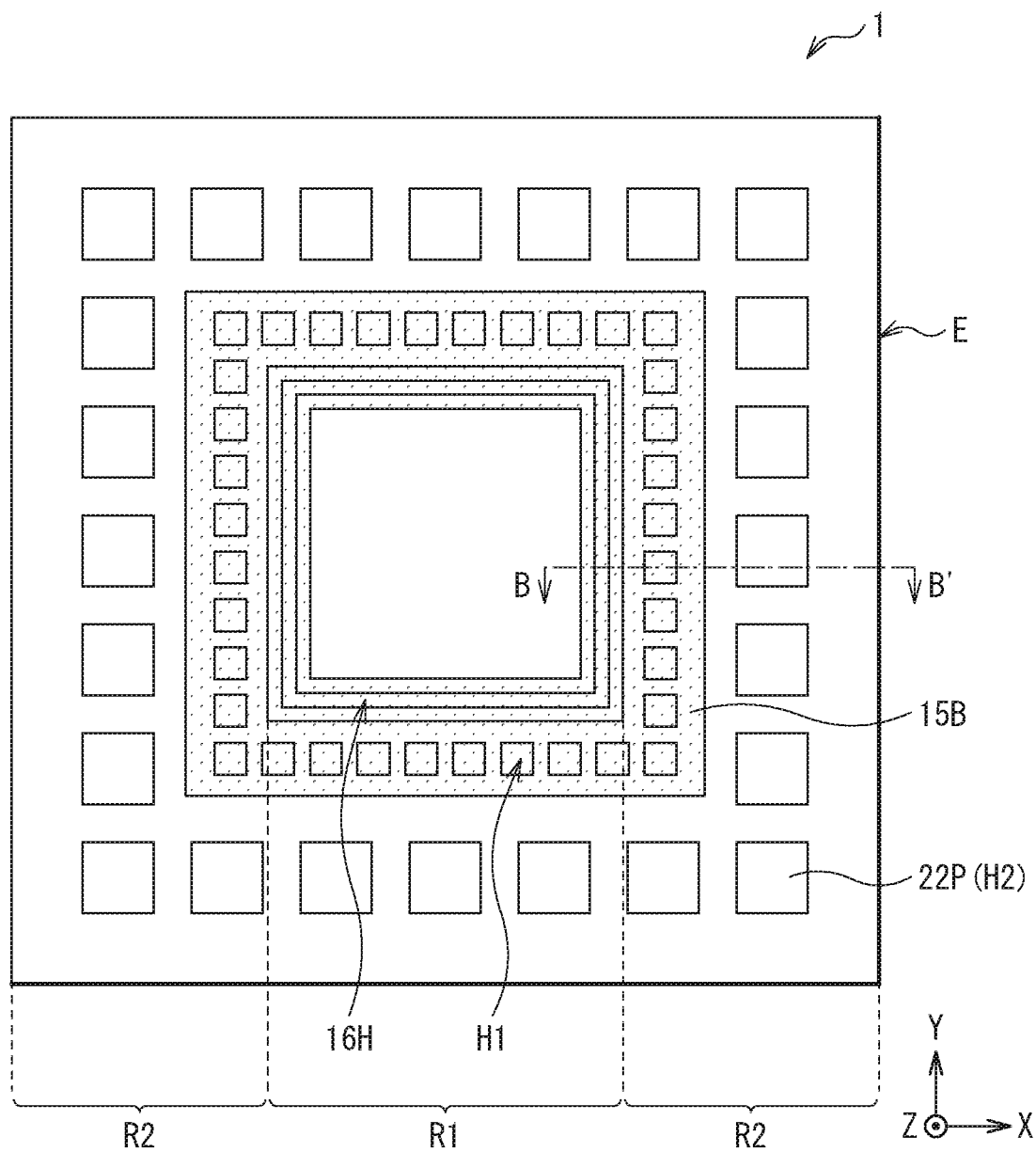
FIG. 1A is a schematic plan view of an outline configuration of a light-receiving element according to a first embodiment of the present disclosure.
Figure 1B:
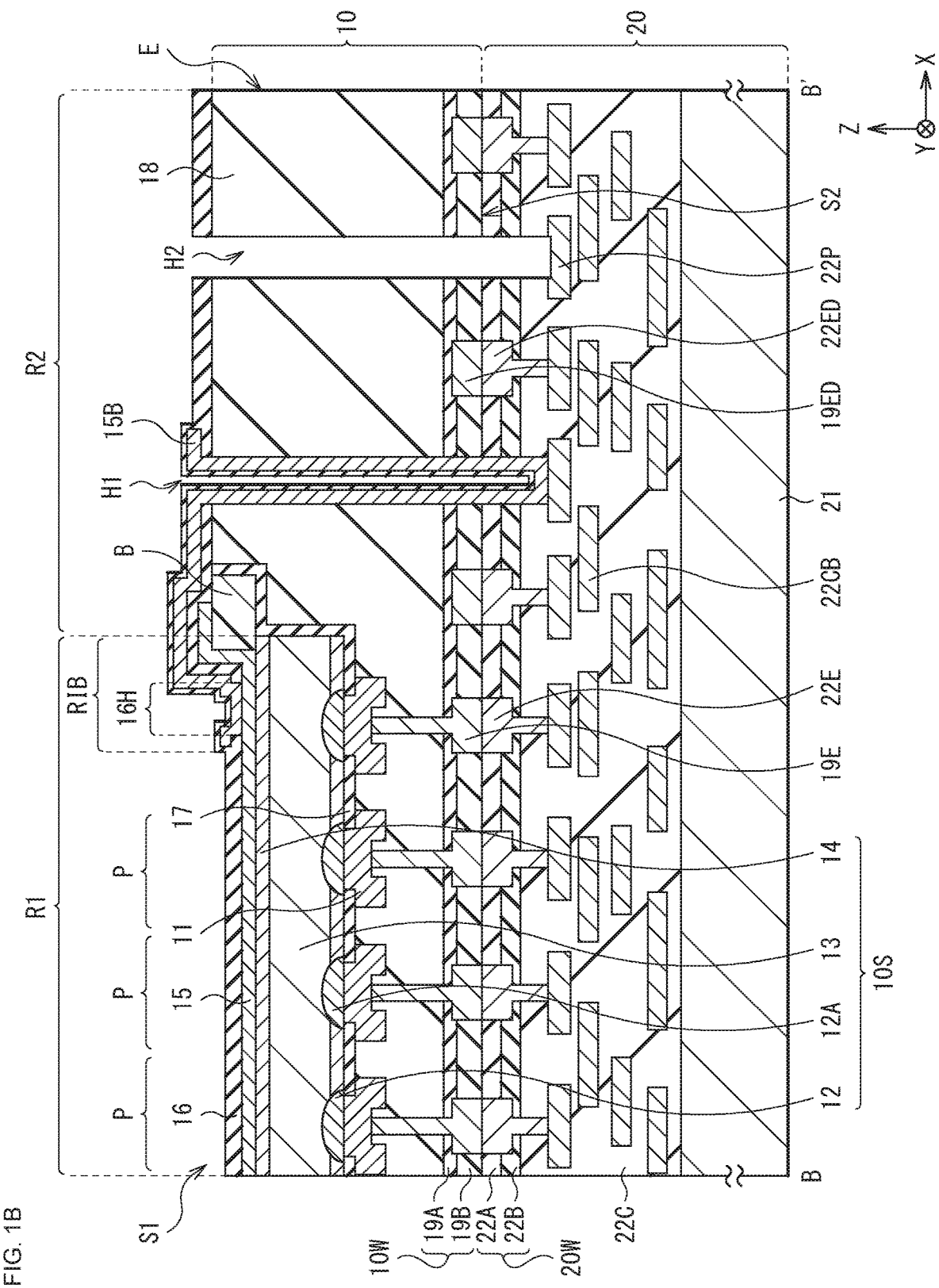
FIG. 1B is a schematic view of a cross-sectional configuration along a line B-B' of FIG. 1A.

[Configuration]
FIGS. 1A and 1B illustrate a schematic configuration of a semiconductor element (a light-receiving element 1) according to a first embodiment of the present disclosure. FIG. 1A illustrates a planar configuration of the light-receiving element 1, and FIG. 1B illustrates a cross-sectional configuration along a line B-B' of FIG. 1A. The light-receiving element 1 is applied to, for example, an infrared sensor or the like that uses a compound semiconductor material such as a group III-V semiconductor, and has a photoelectric conversion function, for example, for light of a wavelength in a visible region (e.g., in a range equal to or more than 380 nm and less than 780 nm) to a short infrared region (e.g., in a range equal to or more than 780 nm and less than 2400 nm). The light-receiving element 1 is provided with a plurality of light-receiving unit regions P (pixels P) arranged two-dimensionally, for example (FIG. 1B).

The light-receiving element 1 includes an element region R1 at a middle part and a peripheral region R2 provided outside the element region R1 and surrounding the element region R1 (FIG. 1A). The light-receiving element 1 includes an electrically-conductive film 15B provided to extend from the element region R1 to the peripheral region R2. The electrically-conductive film 15B has an opening in a region facing the middle part of the element region R1.

The light-receiving element 1 has a stacked structure of an element substrate 10 and a readout circuit substrate 20 (FIG. 1B). One surface of the element substrate 10 is a light incident surface (a light incident surface S1), and a surface (another surface) opposite to the light incident surface S1 is a bonded surface (a bonded surface S2) with respect to the readout circuit substrate 20.

The element substrate 10 includes a wiring layer 10W, a first electrode 11, a semiconductor layer 10S (a first semiconductor layer), a second electrode 15, and a passivation film 16 in this order from a position close to the readout circuit substrate 20. A surface of the semiconductor layer 10S opposed to the wiring layer 10W and an end surface (a side surface) of the semiconductor layer 10S are covered with a passivation film 17. Here, the passivation film 17 corresponds to a specific example of each of a "first passivation film" and a "third passivation film" of the present disclosure, and the passivation film 16 corresponds to a specific example of a "second passivation film" of the present disclosure.

The readout circuit substrate 20 is a so-called ROIC (Readout integrated circuit), and includes a wiring layer 20W in contact with the bonded surface S2 of the element substrate 10, a multilayer wiring layer 22C, and a semiconductor substrate 21 opposed to the element substrate 10 with the wiring layer 20W and the multilayer wiring layer 22C interposed therebetween.

The element substrate 10 includes the semiconductor layer 10S in the element region R1. In other words, a region provided with the semiconductor layer 10S is the element region R1 of the light-receiving element 1. A region, of the element region R1, exposed from the electrically-conductive film 15B (a region facing the opening of the electrically-conductive film 15B) is a light-receiving region. A region, of the element region R1, covered with the electrically-conductive film 15B is an OPB (Optical Black) region R1B. The OPB region R1B is provided to surround the light-receiving region. The OPB region R1B is used to obtain a black-level pixel signal. The element substrate 10 includes an embedded layer 18 together with the passivation film 17 in the element region R1 and the peripheral region R2. The peripheral region R2 is provided with holes H1 and H2 that penetrate the element substrate 10 to reach the readout circuit substrate 20. In the light-receiving element 1, light enters the semiconductor layer 10S from the light incident surface S1 of the element substrate 10, through the passivation film 16, the second electrode 15, and a second contact layer 14.

Signal charges photoelectrically converted in the semiconductor layer 10S moves through the first electrode 11 and the wiring layer 10W, and are read by the readout circuit substrate 20. Hereinafter, description is given of configurations of the respective components.

The wiring layer 10W is provided across the element region R1 and the peripheral region R2, and includes the bonded surface S2 with respect to the readout circuit substrate 20. In the light-receiving element 1, the bonded surface S2 of the element substrate 10 is provided in the element region R1 and the peripheral region R2, and, for example, the bonded surface S2 in the element region R1 and the bonded surface S2 in the peripheral region R2 constitute an identical plane. As described later, in the light-receiving element 1, providing the embedded layer 18 allows for formation of the bonded surface S2 in the peripheral region R2.

The wiring layer 10W includes, for example, a contact electrode 19E and a dummy electrode 19ED in interlayer insulating films 19A and 19B. For example, the interlayer insulating film 19B is disposed on side of the readout circuit substrate 20, and the interlayer insulating film 19A is disposed on side of a first contact layer 12; these interlayer insulating films 19A and 19B are provided to be stacked. The interlayer insulating films 19A and 19B are each constituted by, for example, an inorganic insulating material. Examples of the inorganic insulating material include silicon nitride (SiN), aluminum oxide ($Al_2O_3$), silicon oxide ($SiO_2$), and hafnium oxide ($HfO_2$). The interlayer insulating films 19A and 19B may be each constituted by the same inorganic insulating material.

The contact electrode 19E is provided in the element region R1, for example. The contact electrode 19E serves to electrically couple the first electrode 11 and the readout circuit substrate 20 to each other, and is provided for each pixel P in the element region R1. Neighboring contact electrodes 19E are electrically separated from each other by the embedded layer 18 and the interlayer insulating films 19A and 19B. The contact electrode 19E is constituted by, for example, a copper (Cu) pad, and is exposed to the bonded surface S2. The dummy electrode 19ED is provided, for example, in the peripheral region R2. The dummy electrode 19ED is coupled to a dummy electrode 22ED of the wiring layer 20W described later. Providing the dummy electrode 19ED and the dummy electrode 22ED makes it possible to improve strength of the peripheral region R2. The dummy electrode 19ED is formed in the same step as that of the contact electrode 19E, for example. The dummy electrode 19ED is constituted by, for example, a copper (Cu) pad, and is exposed to the bonded surface S2.

The first electrode 11 is provided between the wiring layer 10W and the semiconductor layer 10S, more specifically between the contact electrode 19E and the semiconductor layer 10S. The first electrode 11 is an electrode (anode) to be supplied with a voltage for reading signal charges (holes or electrons; hereinafter description is given on the assumption that the signal charges are holes, for the sake of convenience) generated in a photoelectric conversion layer 13, and is provided for each pixel P in the element region R1. The first electrode 11 is buried in an opening of the passivation film 17, and is in contact with the semiconductor layer 10S (more specifically, a diffusion region 12A described later). The first electrode 11 is larger than the opening of the passivation film 17, for example, and a portion of the first electrode 11 is provided in the embedded layer 18. That is, an upper surface of the first electrode 11 (a surface on side of the semiconductor layer 10S) is in contact with the diffusion region 12A, and a portion of a lower surface and a side surface of the first electrode 11 are in contact with the embedded layer 18. Neighboring first electrodes 11 are electrically separated from each other by the passivation film 17 and the embedded layer 18.

The first electrode 11 is constituted by, for example, a simple substance of any of titanium (Ti), tungsten (W), titanium nitride (TiN), platinum (Pt), gold (Au), germanium (Ge), palladium (Pd), zinc (Zn), nickel (Ni), and aluminum (Al), or an alloy including at least one of these substances. The first electrode 11 may be a single film of such a constituent material, or may be a stacked film combining two or more thereof. For example, the first electrode 11 is constituted by a stacked film of titanium and tungsten. The first electrode 11 has a thickness of, for example, several dozen nm to several hundred nm.

The semiconductor layer 10S includes, for example, the first contact layer 12, the photoelectric conversion layer 13, and the second contact layer 14 from a position close to the wiring layer 10W. The first contact layer 12, the photoelectric conversion layer 13, and the second contact layer 14 have the same planar shape as each other, and respective end surfaces are disposed at the same position in a plan view.

The first contact layer 12 is provided in common to all of the pixels P, for example, and is disposed between the passivation film 17 and the photoelectric conversion layer 13. The first contact layer 12 serves to electrically separate neighboring pixels P from each other, and the first contact layer 12 is provided with a plurality of diffusion regions 12A, for example. Using, as the first contact layer 12, a compound semiconductor material having a bandgap larger than a bandgap of a compound semiconductor material constituting the photoelectric conversion layer 13 makes it also possible to suppress a dark current. As the first contact layer 12, for example, n-type InP (indium phosphide) may be used.

The diffusion regions 12A provided in the first contact layer 12 are spaced apart from each other. The diffusion region 12A is disposed for each pixel P, and the first electrode 11 is coupled to each diffusion region 12A. The diffusion region 12A is also provided in the OPB region R1B. The diffusion region 12A serves to read the signal charges generated in the photoelectric conversion layer 13 for each pixel P, and includes, for example, p-type impurities. Examples of the p-type impurities include Zn (zinc). In this manner, a p-n junction interface is formed between the diffusion region 12A and the first contact layer 12 other than the diffusion region 12A, thus allowing the neighboring pixels P to be electrically separated from each other. The diffusion region 12A is provided, for example, in a thickness direction of the first contact layer 12, and is also provided in a portion of a thickness direction of the photoelectric conversion layer 13.

The photoelectric conversion layer 13 between the first electrode 11 and the second electrode 15, more specifically between the first contact layer 12 and the second contact layer 14 is provided in common to all of the pixels P, for example. The photoelectric conversion layer 13 absorbs light of a predetermined wavelength to generate signal charges, and is constituted by a compound semiconductor material such as an i-type group III-V semiconductor, for example. Examples of the compound semiconductor material constituting the photoelectric conversion layer 13 include InGaAs (indium gallium arsenide), InAsSb (indium arsenide antimonide), InAs (indium arsenide), InSb (indium antimonide), and HgCdTe (mercury cadmium tellurium). The photoelectric conversion layer 13 may be constituted by Ge (germanium). The photoelectric conversion layer 13 performs photoelectric conversion of light of a wavelength in a visible region to a short infrared region, for example.

The second contact layer 14 is provided in common to all of the pixels P, for example. The second contact layer 14 is provided between the photoelectric conversion layer 13 and the second electrode 15, and is in contact with both of them. The second contact layer 14 is a region through which charges discharged from the second electrode 15 move, and is constituted by, for example, a compound semiconductor including n-type impurities. As the second contact layer 14, for example, n-type InP (indium phosphide) may be used.

The second electrode 15 is provided, for example, as a common electrode to each of the pixels P, on the second contact layer 14 (light incident side) to be in contact with the second contact layer 14. The second electrode 15 serves to discharge charges that are not used as signal charges, of the charges generated in the photoelectric conversion layer 13 (cathode). For example, when holes are read as signal charges from the first electrode 11, for example, electrons may be discharged through the second electrode 15. The second electrode 15 is constituted by, for example, an electrically-conductive film that is able to transmit incident light such as infrared rays. As the second electrode 15, for example, ITO (Indium Tin Oxide), ITiO ($In_2O_3$—$TiO_2$), or the like may be used. Such a second electrode 15 may have a passivation function. The passivation function refers to a protective function to suppress an influence on the semiconductor layer 10S from the outside, and includes a function (moisture-proof function) to suppress infiltration of moisture into the semiconductor layer 10S from the outside, for example. The second electrode 15 may be provided in a lattice shape to partition neighboring pixels P, for example. As the second electrode 15, an electrically-conductive material having low light-transmissivity may be used.

The passivation film 16 covers the second electrode 15 from side of the light incident surface S1, and is opposed to the passivation film 17 with the semiconductor layer 10S interposed therebetween. The passivation film 16 may have an antireflection function together with the passivation function. It may be possible to use, as the passivation film 16, for example, silicon nitride (SiN), aluminum oxide ($Al_2O_3$), silicon oxide ($SiO_2$), tantalum oxide ($Ta_2O_3$), or the like. The passivation film 16 has a thickness of about 100 nm to about 200 nm, for example. The passivation film 16 has an opening 16H in the OPB region R1B. The opening 16H is provided in a frame shape surrounding the light-receiving region, for example (FIG. 1A). The opening 16H may be, for example, a hole having a quadrangular shape or a circular shape in a plan view. The opening 16H of the passivation film 16 allows the electrically-conductive film 15B to be electrically coupled to the second electrode 15.

The passivation film 17 is provided to be in contact with the semiconductor layer 10S, for example. The passivation film 17 is provided between the first contact layer 12 (semiconductor layer 10S) and the wiring layer 10W in the element region R1, and is provided between the embedded layer 18 of the peripheral region R2 and the semiconductor layer 10S. The passivation film 17 continuously covers, for example, a surface of the semiconductor layer 10S opposed to the wiring layer 10W and end surfaces of respective layers of the semiconductor layer 10S. The end surfaces of the respective layers of the semiconductor layer 10S are covered with the passivation film 17 around the entire circumference (around the entire edge of the element region R1). The passivation film 17 is provided across the element region R1 and the peripheral region R2, and is in contact with the passivation film 16 in the peripheral region R2

In this manner, in the present embodiment, the semiconductor layer 10S is provided between the passivation film 17 and the passivation film 16. Accordingly, a surface of the semiconductor layer 10S on side of the bonded surface S2 is protected by the passivation film 17, and a surface of the semiconductor layer 10S on the side of the light incident surface S1 is protected by the passivation film 16. This suppresses the influence on the semiconductor layer 10S from the outside, such as infiltration of moisture, for example. In addition, the passivation film 17 covers the end surfaces of the respective layers of the semiconductor layer 10S continuously from the surface of the semiconductor layer 10S opposed to the wiring layer 10W, thus making it possible to protect the semiconductor layer 10S more effectively. Further, the passivation film 17 is in contact with the passivation film 16 in the peripheral region R2, thus making it possible to enhance the function to protect the semiconductor layer 10S.

As described above, the passivation film 17 has a plurality of openings, in each of which the first electrode 11 is buried, in regions facing the first contact layer 12. In the opening of the passivation film 17, the first electrode 11 suppresses the infiltration of moisture into the semiconductor layer 10S.

The passivation film 17 has a passivation function, and is constituted by, for example, silicon nitride (SiN), etc. The passivation film 17 may include an oxide such as silicon oxide ($SiO_X$) or aluminum oxide ($Al_2O_3$). The passivation film 17 may be constituted by a stacked structure including a plurality of films. The passivation film 17 may be constituted by, for example, a silicon (Si)-based insulating material such as silicon oxynitride (SiON), carbon-containing silicon oxide (SiOC), and silicon carbide (SiC). The passivation film 17 has a thickness of about 100 nm to about 200 nm, for example.

The electrically-conductive film 15B is provided to extend from the OPB region R1B to the hole H1 in the peripheral region R2. The electrically-conductive film 15B is in contact with the second electrode 15 at the opening 16H of the passivation film 16 provided in the OPB region R1B, and is in contact with a wiring line (a wiring line 22CB described later) of the readout circuit substrate 20 via the hole H1. This allows a voltage to be supplied from the readout circuit substrate 20 to the second electrode 15 via the electrically-conductive film 15B. The electrically-conductive film 15B functions as a voltage-supply path to the second electrode 15, and also has a function as a light-shielding film to form the OPB region R1B. The electrically-conductive film 15B is constituted by, for example, a metal material including tungsten (W), aluminum (Al), titanium (Ti), titanium nitride (TiN), molybdenum (Mo), tantalum (Ta), or copper (Cu). Such an electrically-conductive film 15B may have a passivation function, or a passivation film may be provided on the electrically-conductive film 15B.

An adhesive layer B may be provided between an end of the second contact layer 14 and the second electrode 15. As described later, this adhesive layer B is used when forming the light-receiving element 1, and assumes a role of bonding the semiconductor layer 10S to a temporary substrate (a temporary substrate 33 in FIG. 5C described later). The adhesive layer B is constituted by, for example, tetraethoxysilane (TEOS), silicon oxide ($SiO_2$), or the like. The adhesive layer B is provided to have an increased width with respect to an end surface of the semiconductor layer 10S, for example, and is covered with the embedded layer 18 together with the semiconductor layer 10S. The passivation film 17 is provided between the adhesive layer B and the embedded layer 18.

Figure 2:
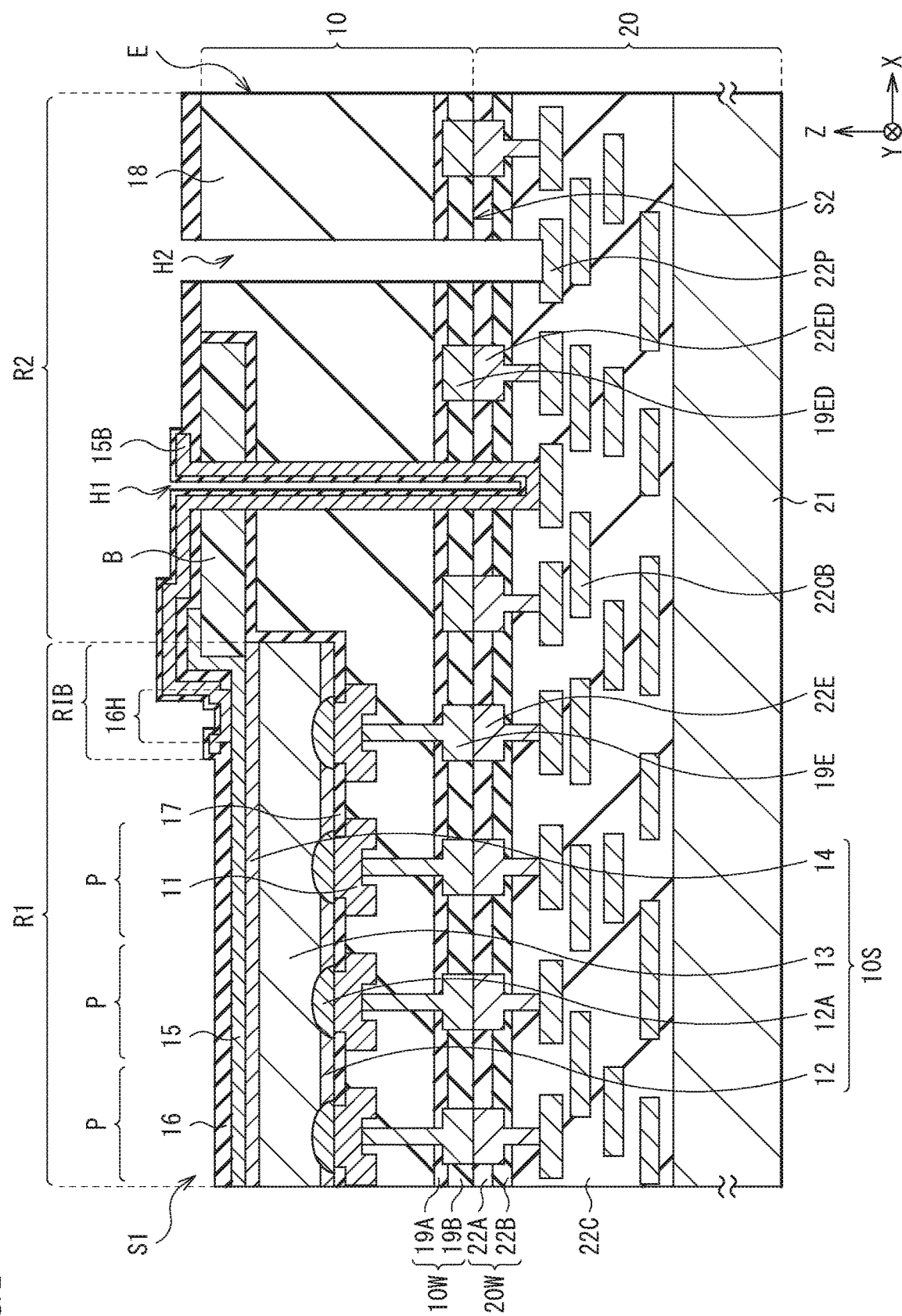
FIG. 2 is a schematic cross-sectional view of another example (1) of a configuration of an adhesive layer illustrated in FIG. 1B.
Figure 3:
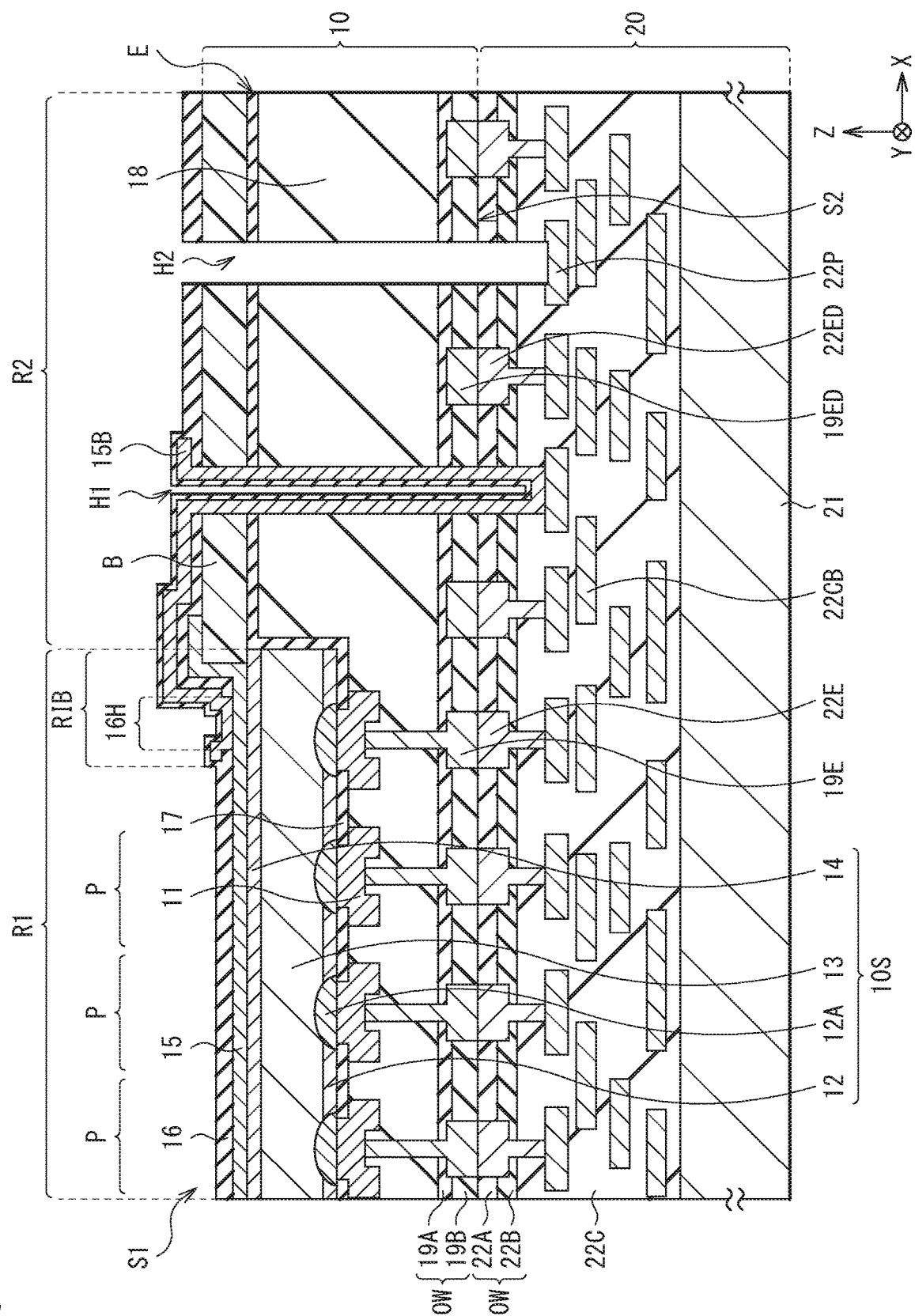
FIG. 3 is a schematic cross-sectional view of another example (2) of the configuration of the adhesive layer illustrated in FIG. 1B.

FIGS. 2 and 3 each illustrate another example of the configuration of the adhesive layer B. The adhesive layer B may be provided across a wide region of the peripheral region R2, and may extend, for example, from the vicinity of an edge of the semiconductor layer 10S (element region R1) to a location between the hole H1 and the hole H2 (FIG. 2). Alternatively, the adhesive layer B may extend from the vicinity of the edge of the semiconductor layer 10S (element region R1) to a chip end (a chip end E).

The embedded layer 18 serves to fill a level difference between the temporary substrate (the temporary substrate 33 in FIG. 5C described later) and the semiconductor layer 10S in a manufacturing step of the light-receiving element 1. In the present embodiment, the formation of the embedded layer 18 suppresses occurrence of a defect in the manufacturing step due to the level difference between the semiconductor layer 10S and the temporary substrate 33, although detailed description is given later.

The embedded layer 18 in the peripheral region R2 is provided between the wiring layer 10W and the passivation film 17 and between the wiring layer 10W and the passivation film 16, and has a thickness equal to or larger than a thickness of the semiconductor layer 10S, for example. Here, the embedded layer 18 is provided to surround the semiconductor layer 10S, and thus a region (peripheral region R2) around the semiconductor layer 10S is formed. This enables the bonded surface S2 with respect to the readout circuit substrate 20 to be provided in the peripheral region R2. When the bonded surface S2 is formed in the peripheral region R2, the thickness of the embedded layer 18 may be reduced; however, it is preferable that the embedded layer 18 cover the semiconductor layer 10S in a thickness direction and that the entire end surface of the semiconductor layer 10S be covered with the embedded layer 18. Covering the entire end surface of the semiconductor layer 10S with the embedded layer 18 with the passivation film 17 in between makes it possible to effectively suppress infiltration of moisture into the semiconductor layer 10S. The embedded layer 18 in the element region R1 is provided between the semiconductor layer 10S and the wiring layer 10W to cover the first electrode 11.

A surface of the embedded layer 18 on the side of the bonded surface S2 is planarized, and the wiring layer 10W is provided on the planarized surface of the embedded layer 18 in the peripheral region R2. It may be possible to use, as the embedded layer 18, for example, an inorganic insulating material such as silicon oxide ($SiO_X$), silicon nitride (SiN), silicon oxynitride (SiON), carbon-containing silicon oxide (SiOC), and silicon carbide (SiC).

Figure 15A:
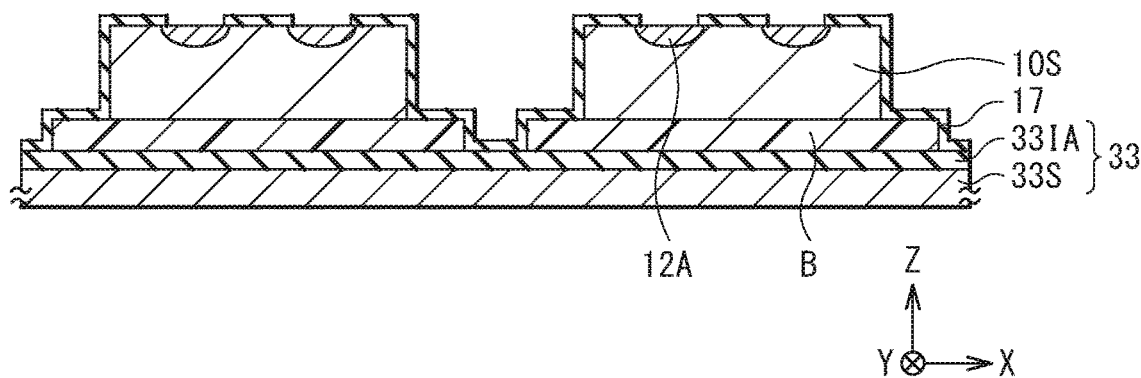
FIG. 15A is a schematic cross-sectional view of a step subsequent to FIG. 9B.
Figure 15B:
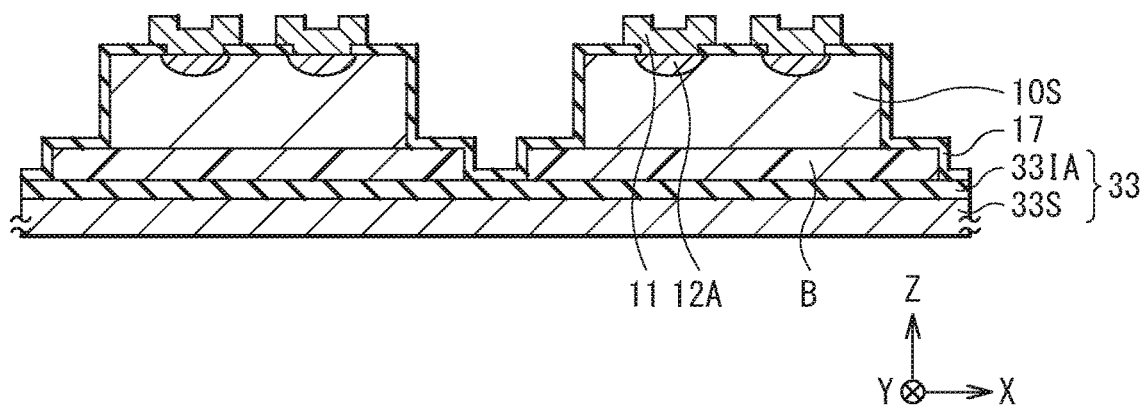
FIG. 15B is a schematic cross-sectional view of a step subsequent to FIG. 15A.
Figure 15C:
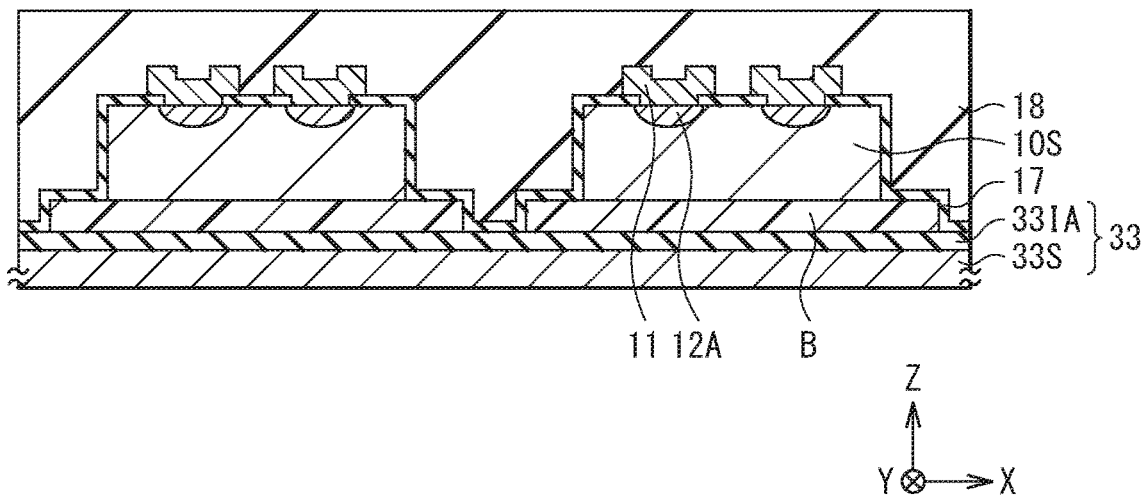
FIG. 15C is a schematic cross-sectional view of a step subsequent to FIG. 15B.
Figure 15D:
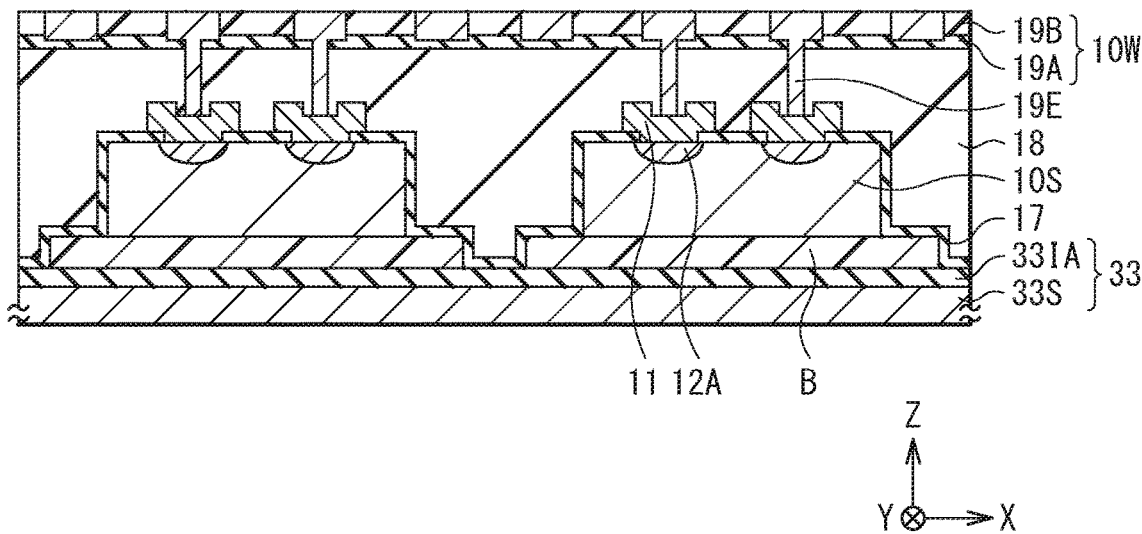
FIG. 15D is a schematic cross-sectional view of a step subsequent to FIG. 15C.

As described later, in the step of manufacturing the light-receiving element 1, the embedded layer 18 is formed, and thereafter the wiring layer 10W including the interlayer insulating films 19A and 19B and the contact electrode 19E is formed above the embedded layer 18 (FIG. 15D described later). The readout circuit substrate 20 including the wiring layer 20W is attached to the element substrate 10 including the wiring layer 10W (FIG. 15E described later) to form the light-receiving element 1. At this time, the contact electrode 19E of the wiring layer 10W and a contact electrode 22E of the wiring layer 20W are coupled to each other. The contact electrodes 19E and 22E each include, for example, a Cu pad; this direct bonding of the Cu pads allows the contact electrodes 19E and 22E to be coupled to each other. When forming the contact electrode 19E by means of a CMP (Chemical Mechanical Polishing) method, the embedded layer 18 disposed below a copper film to be polished is required to have hardness that makes it possible to withstand stress during the polishing. In addition, in order to directly bond the Cu-pads of the contact electrodes 19E and 22E to each other, it is necessary to form the element substrate 10 and the readout circuit substrate 20 to be extremely planar. For this reason, it is preferable that the embedded layer 18 disposed below the copper film have hardness that makes it possible to withstand stress during the polishing. Specifically, a constituent material of the embedded layer 18 is preferably a material having higher hardness than that of a sealant or an organic material disposed around a die in a typical semiconductor package. Examples of the material having such high hardness include an inorganic insulating material. Employing, for example, a CVD (Chemical Vapor Deposition) method, a sputtering method, or a coating method to form, as a film, the inorganic insulating material, thus enabling formation of the embedded layer 18.

The peripheral region R2 is provided with the holes H1 and H2 that penetrate the embedded layer 18. The holes H1 and H2 penetrate the wiring layer 10W in addition to the embedded layer 18 to reach the readout circuit substrate 20. The holes H1 and H2 have a rectangular planar shape, for example, and respective pluralities of holes H1 and H2 are provided to surround the element region R1 (FIG. 1A). The hole H1 is provided at a position closer to the element region R1 than the hole H2, and a side wall and a bottom surface of the hole H1 are covered with the electrically-conductive film 15B. The hole H1 serves to couple the second electrode 15 (electrically-conductive film 15B) and a wiring line (wiring line 22CB described later) of the readout circuit substrate 20 to each other, and is provided to penetrate the passivation film 16, the embedded layer 18, and the wiring layer 10W. A groove (e.g., a groove G in FIG. 4 described later) provided in the peripheral region R2 may be employed instead of the hole H1 to thereby electrically couple the electrically-conductive film 15B and a wiring line of the readout circuit substrate 20 to each other.

Figure 4:
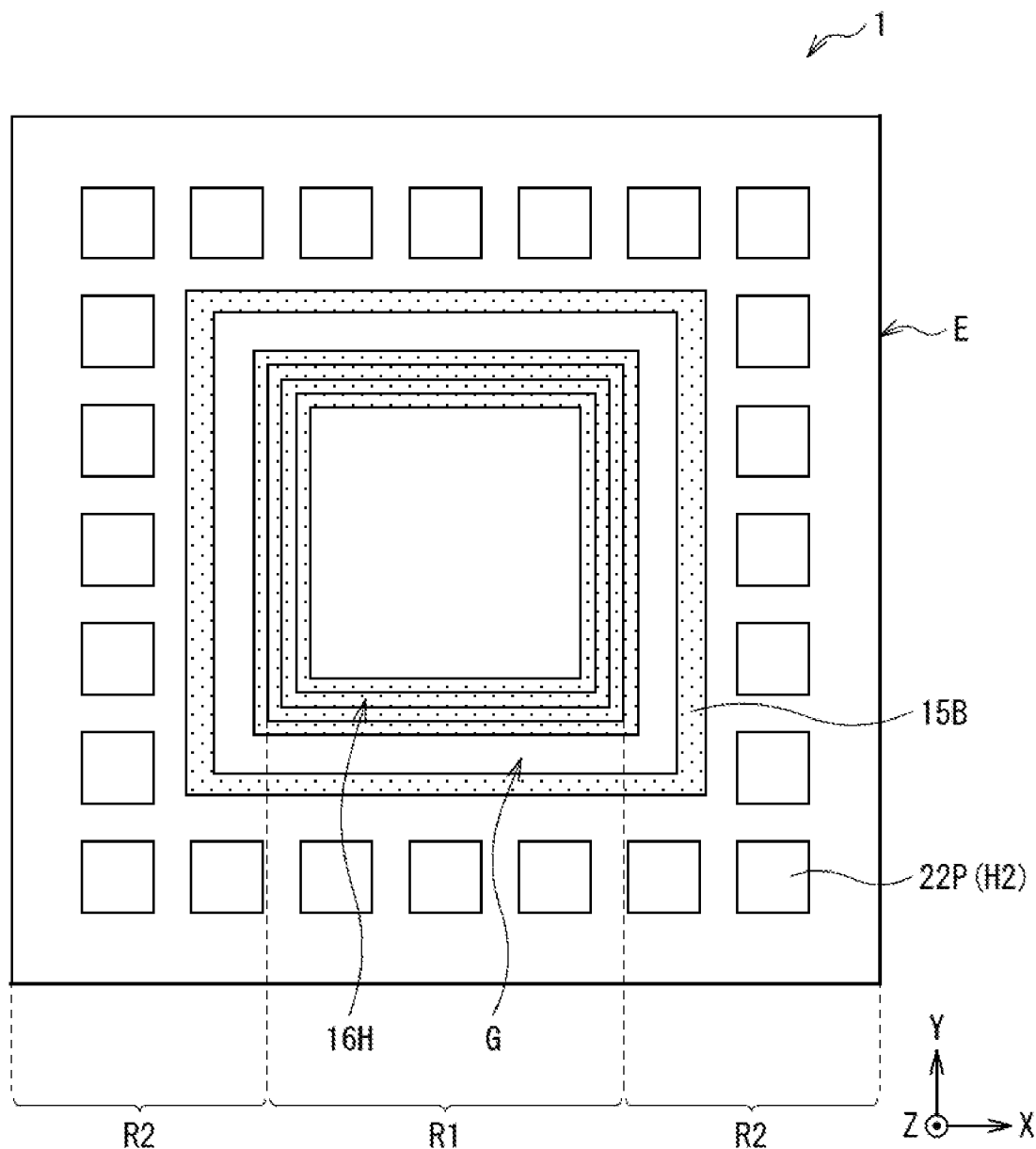
FIG. 4 is a schematic view of another example of a planar configuration of the light-receiving element illustrated in FIG. 1A.

FIG. 4 illustrates an example of a planar configuration of the groove G for electrically coupling the electrically-conductive film 15B and the wiring line of the readout circuit substrate 20 to each other. The groove G is provided to surround the element region R1. That is, the groove G is provided in a moat shape. Similarly to the hole H1, the groove G is provided, for example, to penetrate the passivation film 16, the embedded layer 18, and the wiring layer 10W, and the electrically-conductive film 15B is provided on a side surface and a bottom surface of the groove G. Providing the moat-shaped groove G makes it possible to more effectively suppress the influence on the semiconductor layer 10S from the outside. The groove G or the hole H1 corresponds to a specific example of a "coupling part" of the present disclosure.

The hole H2 is provided at a position closer to the chip end E than the hole H1 (or groove G), for example. The hole H2 penetrates the passivation film 16, the embedded layer 18, and the wiring layer 10W to reach a pad electrode (a pad electrode 22P described later) of the readout circuit substrate 20. The hole H2 allows for electrical coupling between the outside and the light-receiving element 1. Neither the hole H1 nor the hole H2 may reach the readout circuit substrate 20. For example, the holes H1 and H2 may reach a wiring line of the wiring layer 10W, and the wiring line may be coupled to the wiring line 22CB and the pad electrode 22P of the readout circuit substrate 20. The holes H1 and H2 may penetrate the adhesive layer B (FIGS. 2 and 3).

Holes and electrons generated at the photoelectric conversion layer 13 are read from the first electrode 11 and the second electrode 15. In order to perform the reading operation at high speed, the distance between the first electrode 11 and the second electrode 15 is preferably set to a distance that is enough for photoelectric conversion but is not too far. That is, it is preferable to reduce a thickness of the element substrate 10. For example, the distance between the first electrode 11 and the second electrode 15 or the thickness of the element substrate 10 is 10 µm or less, further 7 µm or less, and furthermore 5 µm or less.

The semiconductor substrate 21 of the readout circuit substrate 20 is opposed to the element substrate 10, with the wiring layer 20W and the multilayer wiring layer 22C interposed therebetween. The semiconductor substrate 21 is constituted by, for example, silicon (Si). A plurality of transistors is provided near a surface of the semiconductor substrate 21 (a surface on side of the wiring layer 20W). For example, the plurality of transistors is used to constitute a readout circuit (Read Out Circuit) for each pixel P. The wiring layer 20W includes, for example, an interlayer insulating film 22A and an interlayer insulating film 22B in this order from side of the element substrate 10, and these interlayer insulating films 22A and 22B are provided to be stacked. For example, the contact electrode 22E and the dummy electrode 22ED are provided in the interlayer insulating film 22A. The multilayer wiring layer 22C is provided to be opposed to the element substrate 10 with the wiring layer 20W interposed therebetween. For example, the pad electrode 22P and a plurality of wiring lines 22CB are provided in the multilayer wiring layer 22C. The interlayer insulating films 22A and 22B are each constituted by, for example, an inorganic insulating material. Examples of the inorganic insulating material include silicon nitride (SiN), aluminum oxide ($Al_2O_3$), silicon oxide ($SiO_2$), and hafnium oxide ($HfO_2$).

The contact electrodes 22E serves to electrically couple the first electrode 11 and the wiring line 22CB to each other, and is provided for each pixel P in the element region R1. The contact electrode 22E is in contact with the contact electrode 19E at the bonded surface S2 of the element substrate 10. Neighboring contact electrodes 22E are electrically separated from each other by the interlayer insulating film 22A.

The dummy electrode 22ED provided in the peripheral region R2 is in contact with the dummy electrode 19ED at the bonded surface S2 of the element substrate 10. The dummy electrode 22ED is formed in the same step as that of the contact electrode 22E, for example. The contact electrode 22E and the dummy electrode 22ED are each constituted by, for example, a copper (Cu) pad, and are exposed to a surface, of the readout circuit substrate 20, facing the element substrate 10. That is, for example, Cu—Cu bonding is established between the contact electrode 19E and the contact electrode 22E and between the dummy electrode 19ED and the dummy electrode 22ED. This enables miniaturization of the pixel P, although detailed description is given later.

The wiring line 22CB coupled to the contact electrode 19E is coupled to a transistor provided near the surface of the semiconductor substrate 21, thus allowing the first electrode 11 and a readout circuit to be coupled to each other for each pixel P. The wiring line 22CB coupled to the electrically-conductive film 15B via the hole H1 is coupled to a predetermined potential, for example. In this manner, one (e.g., holes) of the charges generated in the photoelectric conversion layer 13 are read by the readout circuit from the first electrode 11 via the contact electrodes 19E and 22E. The other (e.g., electrons) of the charges generated in the photoelectric conversion layer 13 are discharged to a predetermined potential from the second electrode 15 via the electrically-conductive film 15B.

The pad electrode 22P provided in the peripheral region R2 serves to allow for electrical coupling to the outside. The hole H2 that penetrates the element substrate 10 to reach the pad electrode 22P is provided near the chip end E of the light-receiving element 1, and the hole H2 allows for electrical coupling to the outside. The coupling is established by a method such as wire bonding or bump, for example. For example, a predetermined potential may be supplied to the second electrode 15 from an external terminal disposed in the hole H2 via the wiring line 22CB of the hole H2 readout circuit substrate 20 and the electrically-conductive film 15B. As a result of the photoelectric conversion in the photoelectric conversion layer 13, a signal voltage read from the first electrode 11 may be read by the readout circuit of the semiconductor substrate 21 via the contact electrodes 19E and 22E, and the signal voltage may be outputted to the external terminal disposed in the hole H2 via the readout circuit. The signal voltage may be outputted to the external terminal via other circuits, in addition to the readout circuit, included in the readout circuit substrate 20, for example. Other circuits refer to a signal processing circuit, an output circuit, and the like, for example.

A thickness of the readout circuit substrate 20 is preferably larger than the thickness of the element substrate 10. For example, the thickness of the readout circuit substrate 20 is preferably two times or more larger than the thickness of the element substrate 10, more preferably five times or more, and still more preferably ten times or more. Alternatively, the thickness of the readout circuit substrate 20 is, for example, 100 μm or more, 150 μm or more, or 200 μm or more. The readout circuit substrate 20 having such a large thickness ensures mechanical strength of the light-receiving element 1. It is to be noted that the readout circuit substrate 20 either may include only one layer of the semiconductor substrate 21 forming the circuit, or may further include a substrate such as a support substrate, in addition to the semiconductor substrate 21 forming the circuit.

[Method of Manufacturing Light-Receiving Element 1]

The light-receiving element 1 may be manufactured, for example, as follows. FIGS. 5A, 5B, 5C, 6, 7, 8A, 8B, 9A, 9B, 10A, 10B, 11A, 11B, 12A, 12B, 13, 14, 15A, 15B, 15C, 15D, 15E, 15F, 15G, 15H, 15I, and 15J illustrate manufacturing steps of the light-receiving element 1 in the order of steps.

Figure 5A:
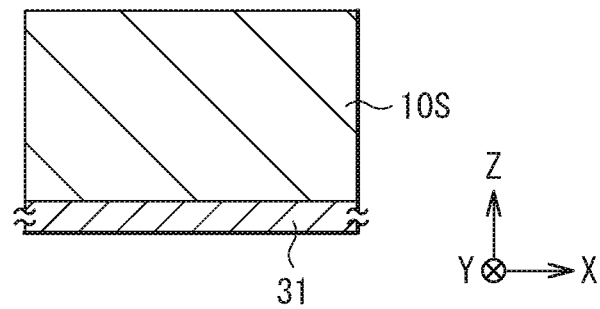
FIG. 5A is a schematic cross-sectional view for describing one step of a method of manufacturing the light-receiving element illustrated in FIGS. 1A and 1B.
Figure 5B:
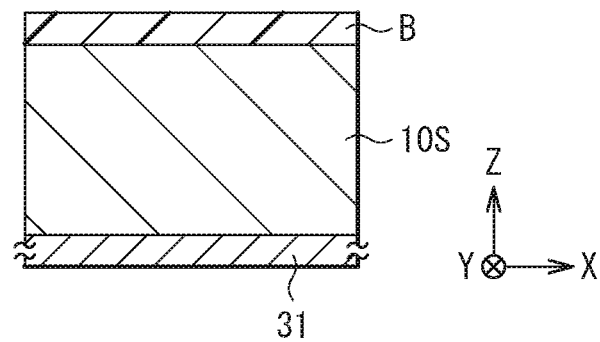
FIG. 5B is a schematic cross-sectional view of a step subsequent to FIG. 5A.

First, as illustrated in FIG. 5A, the semiconductor layer 10S is epitaxially grown on a growth substrate 31 including InP, for example. The growth substrate 31 has a thickness of several hundred μm, for example, and the semiconductor layer 10S has a thickness of several μm, for example. Thereafter, the adhesive layer B is formed, as a film, on the semiconductor layer 10S, as illustrated in FIG. 5B. The growth substrate 31 has a bore of six inches or less, for example. The formation of the semiconductor layer 10S is performed, for example, by epitaxially growing n-type InP constituting the first contact layer 12, i-type InGaAs constituting the photoelectric conversion layer 13, and n-type InP constituting the second contact layer 14 in this order. For example, a buffer layer and a stopper layer may be formed on the growth substrate 31, and thereafter the semiconductor layer 10S may be formed.

Figure 5C:
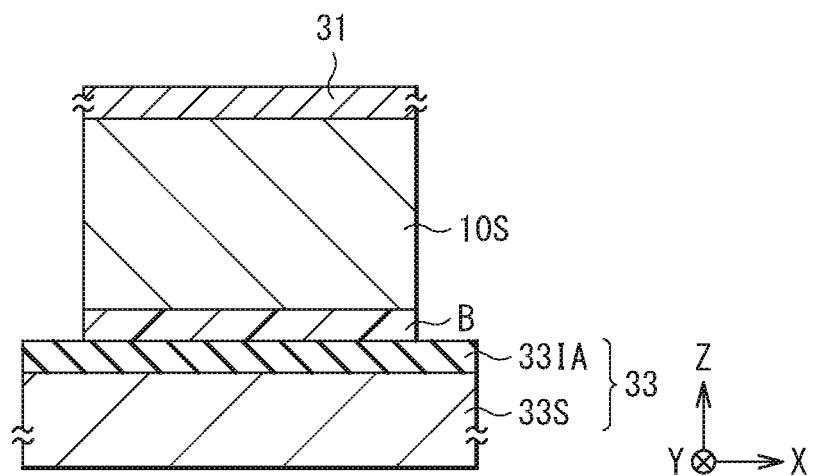
FIG. 5C is a schematic cross-sectional view of a step subsequent to FIG. 5B.

Next, as illustrated in FIG. 5C, the growth substrate 31 on which the semiconductor layer 10S is formed is bonded to the temporary substrate 33 with the adhesive layer B interposed therebetween. The temporary substrate 33 includes, for example, an insulating layer (an insulating layer 33IA), and a substrate 33S. The insulating layer 33IA is disposed, for example, between the adhesive layer B and the substrate 33S. As the temporary substrate 33, a substrate is used which has a larger bore than that of the growth substrate 31; as the substrate 33S, for example, a silicon (Si) substrate is used. The temporary substrate 33 has a bore of, for example, eight inches to twelve inches. Bonding the growth substrate 31 of a small bore to the temporary substrate 33 of a large bore enables use of various devices for a substrate of a large bore when forming the element substrate 10. This allows for Cu—Cu bonding as the bonding between the readout circuit substrate 20 and the element substrate 10, for example, thus making it possible to miniaturize the pixel P. The bonding of the growth substrate 31 to the temporary substrate 33 may be performed by plasma-activated bonding, normal temperature bonding, bonding using an adhesive (adhesive bonding), or the like. In this manner, for example, a wafer-shaped semiconductor layer 10S is bonded to the temporary substrate 33. The temporary substrate 33 has a thickness of several hundred μm, for example.

Figure 6:
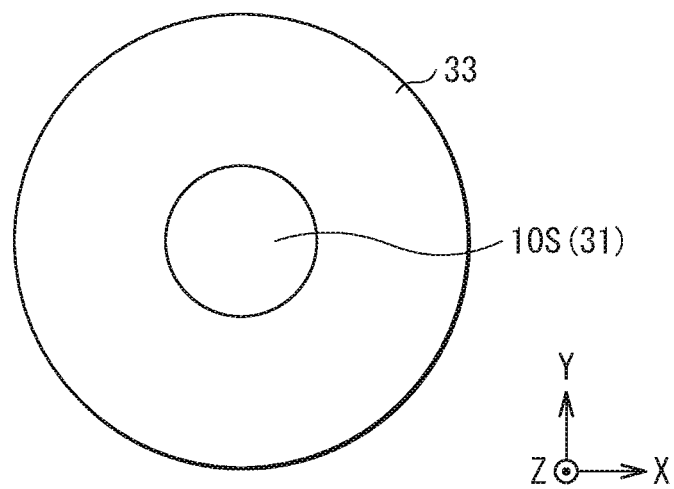
FIG. 6 is a schematic plan view of an example of a step of FIG. 5C.
Figure 7:
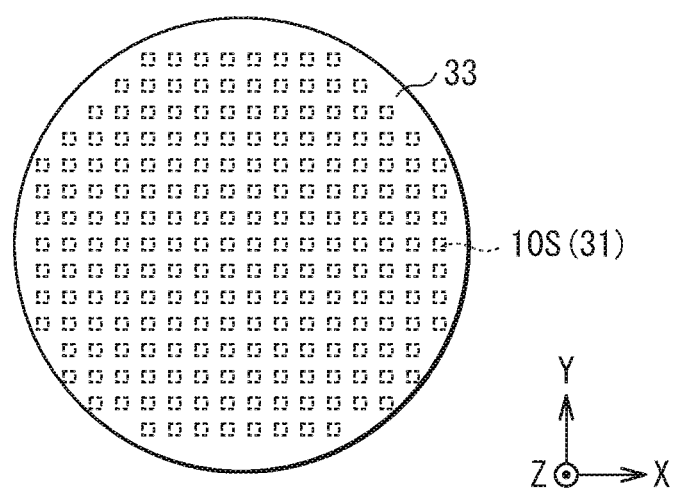
FIG. 7 is a schematic plan view of another example (1) of a configuration of a semiconductor layer illustrated in FIG. 6.

FIGS. 6 and 7 each illustrate an example of a planar configuration of the temporary substrate 33 and the semiconductor layer 10S (growth substrate 31). The semiconductor layer 10S in a wafer state smaller than the temporary substrate 33 may be bonded to the temporary substrate 33 in a wafer state (FIG. 6), or a plurality of semiconductor layers 10S in a chip state may be bonded, in a state of being apart from one another, to the temporary substrate 33 in a wafer state (FIG. 7).

Figure 8A:
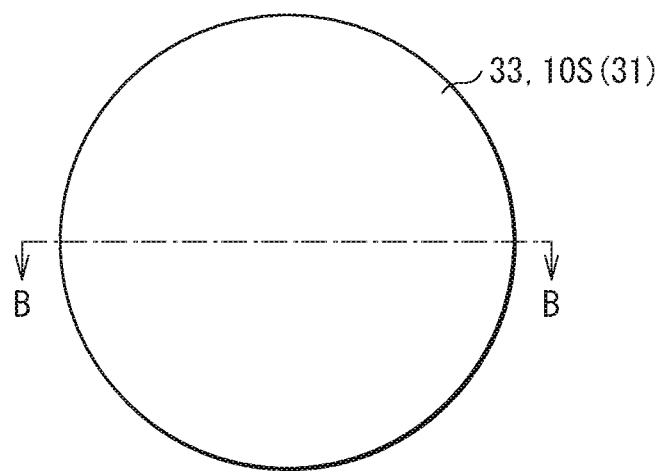
FIG. 8A is a schematic plan view of another example (2) of the configuration of the semiconductor layer illustrated in FIG. 6.
Figure 8B:
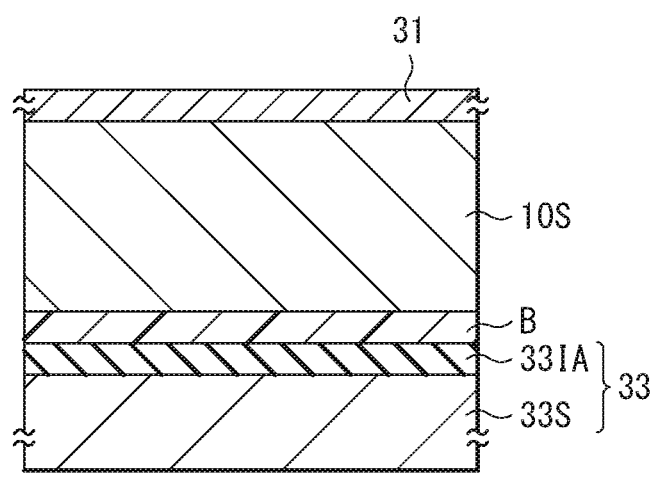
FIG. 8B is a schematic view of a cross-sectional configuration along a line B-B illustrated in FIG. 8A.

Alternatively, as illustrated in FIGS. 8A and 8B, the semiconductor layer 10S in a wafer state of the same size as that of the temporary substrate 33 may be bonded to the temporary substrate 33 in a wafer state. FIG. 8A illustrates a planar configuration of the temporary substrate 33 and the semiconductor layer 10S (growth substrate 31), and FIG. 8B illustrates a cross-sectional configuration along a line B-B of FIG. 8A.

Figure 9A:
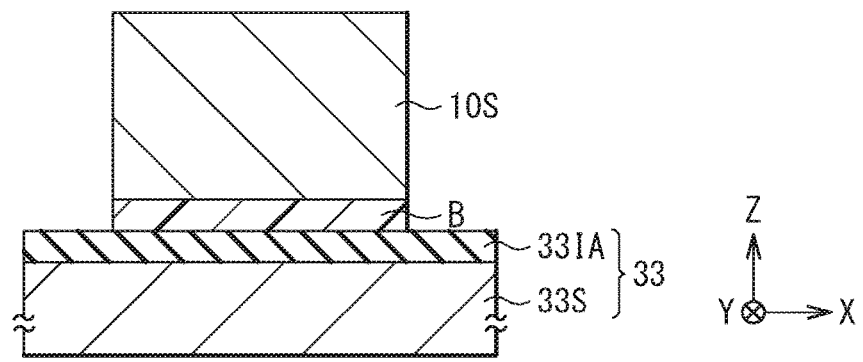
FIG. 9A is a schematic cross-sectional view of a step subsequent to FIG. 5C.

After bonding the growth substrate 31 on which the semiconductor layer 10S is formed to the temporary substrate 33, the growth substrate 31 is removed as illustrated in FIG. 9A. The removal of the growth substrate 31 may be performed by mechanical grinding, CMP (Chemical Mechanical Polishing: chemical mechanical polishing), wet etching, dry etching, or the like. At this time, a portion of the growth substrate 31 may remain. In addition, the semiconductor layer 10S may be partially etched.

Figure 9B:
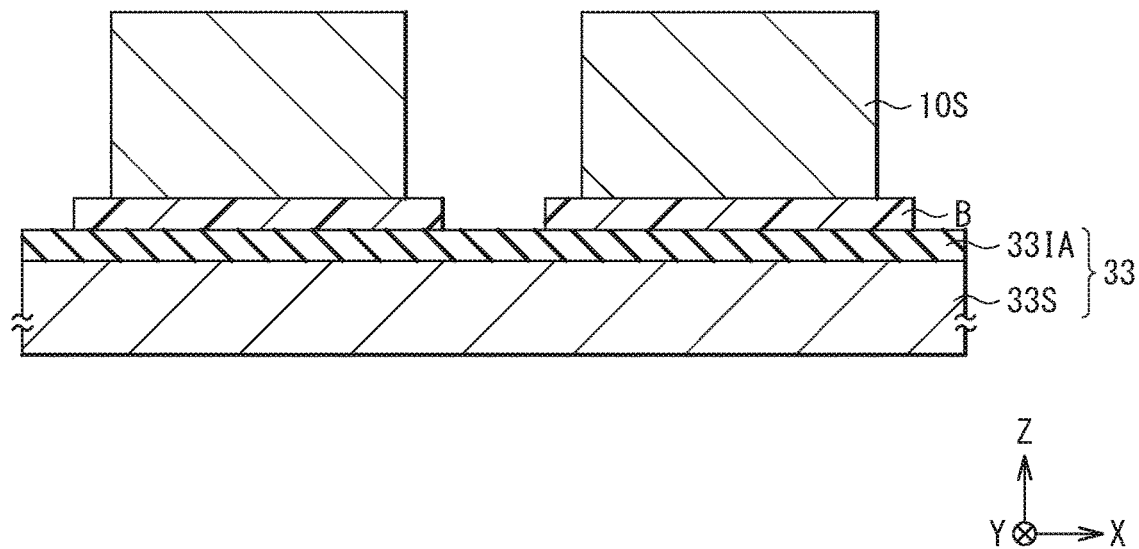
FIG. 9B is a schematic cross-sectional view of a step subsequent to FIG. 9A.

Subsequently, as illustrated in FIG. 9B, for example, the semiconductor layer 10S is etched to a predetermined size in accordance with marking of the temporary substrate 33. This allows for formation of semiconductor layers 10S in a state of a plurality of chips. FIG. 9B and subsequent drawings illustrate two semiconductor layers 10S among the semiconductor layers 10S in the state of a plurality of chips.

Figure 10A:
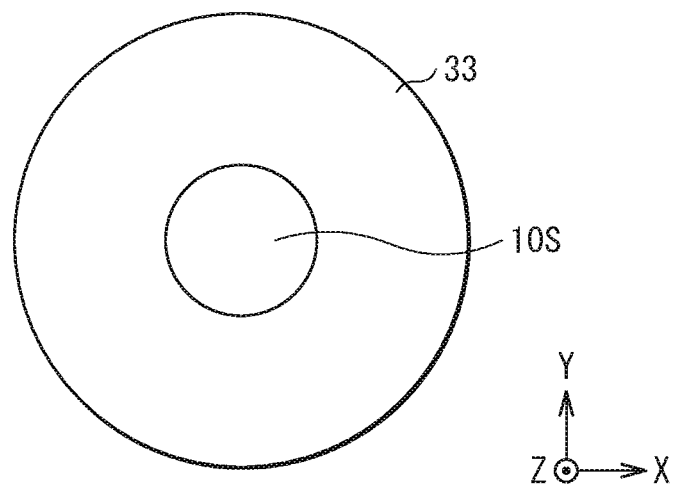
FIG. 10A is a schematic view of an example of a planar configuration of the step illustrated in FIG. 9A.
Figure 10B:
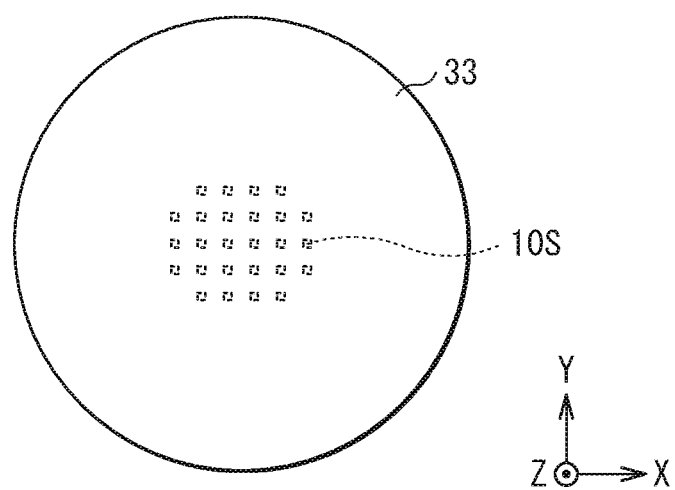
FIG. 10B is a schematic view of an example of a planar configuration of the step illustrated in FIG. 9B.
Figure 11A:
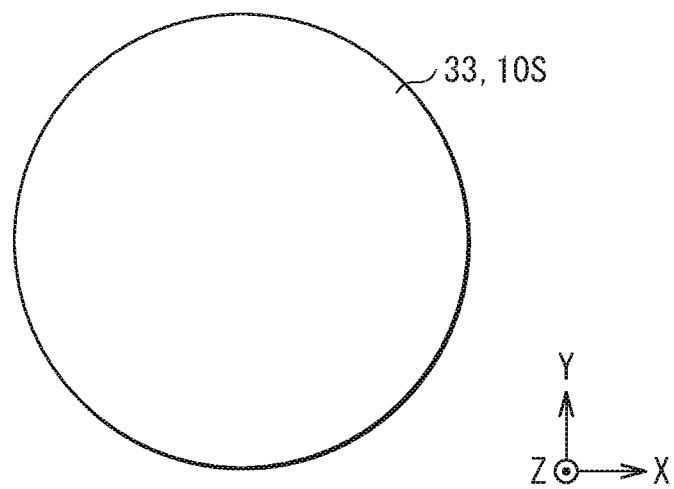
FIG. 11A is a schematic view of another example (1) of a planar configuration of the step illustrated in FIG. 9A.
Figure 11B:
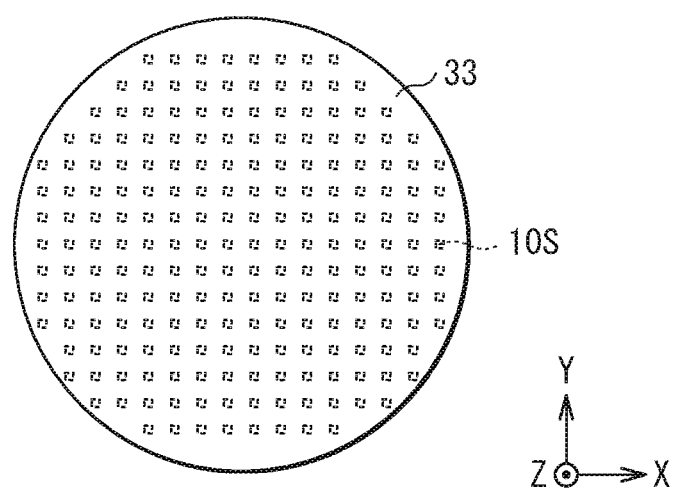
FIG. 11B is a schematic view of another example (1) of a planar configuration of the step illustrated in FIG. 9B.

FIG. 10A illustrates an example of a planar configuration of the semiconductor layer 10S prior to molding, and FIG. 10B illustrates an example of a planar configuration of the semiconductor layer 10S after the molding subsequent to FIG. 10A. FIG. 11A illustrates another example of the planar configuration of the semiconductor layer 10S prior to the molding, and FIG. 11B illustrates another example of the planar configuration of the semiconductor layer 10S after the molding subsequent to FIG. 11A. Thus, the semiconductor layer 10S in a wafer state smaller than the temporary substrate 33 (FIG. 10A) or the same size as the temporary substrate 33 (FIG. 11A) is molded into the semiconductor layers 10S in a state of a plurality of chips.

Figure 12A:
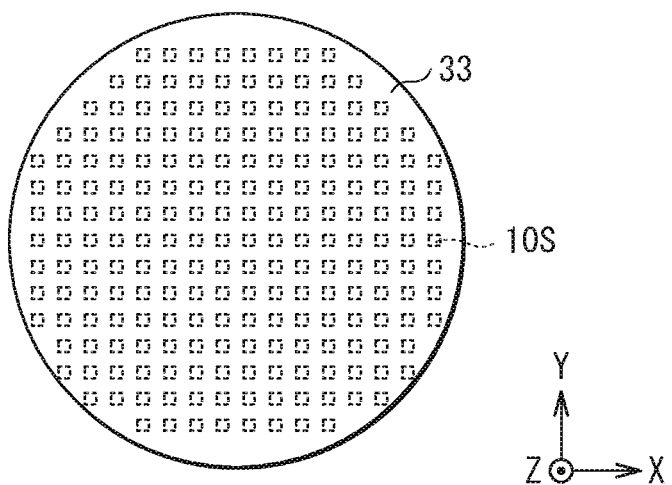
FIG. 12A is a schematic view of another example (2) of the planar configuration of the step illustrated in FIG. 9A.
Figure 12B:
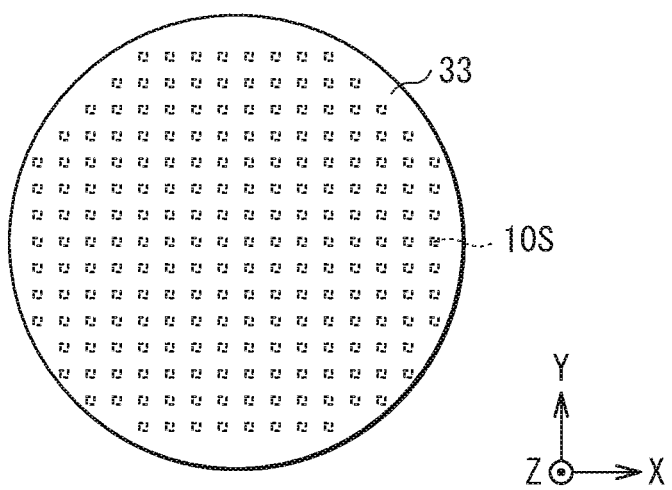
FIG. 12B is a schematic view of another example (2) of the planar configuration of the step illustrated in FIG. 9B.

Alternatively, as illustrated in FIGS. 12A and 12B, a plurality of semiconductor layers 10S in a chip state may be molded into a plurality of semiconductor layers 10S in a smaller chip state.

Upon etching of the semiconductor layer 10S, the adhesive layer B is etched together with the semiconductor layer 10S, for example. The adhesive layer B may remain to have increased width as compared with the semiconductor layer 10S, and the adhesive layer B may extend around the semiconductor layer 10S (FIG. 9B).

Figure 13:
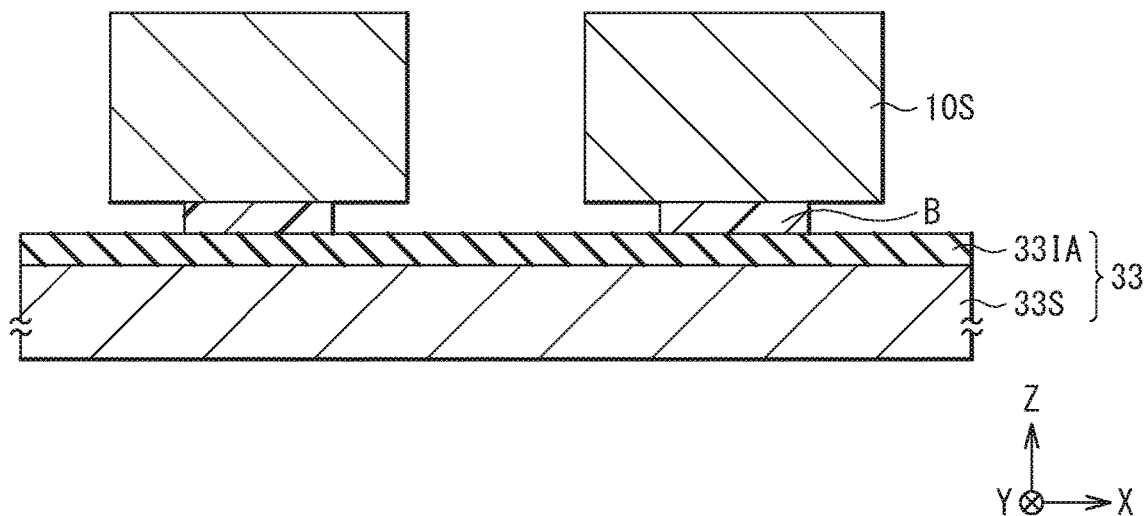
FIG. 13 is a schematic cross-sectional view of another example (1) of the step illustrated in FIG. 9B.

Alternatively, as illustrated in FIG. 13, the adhesive layer B may be narrower than the semiconductor layer 10S, and there may be a gap between the semiconductor layer 10S and the temporary substrate 33. The adhesive layer B may be etched to have the same size as that of the semiconductor layer 10S.

Figure 14:
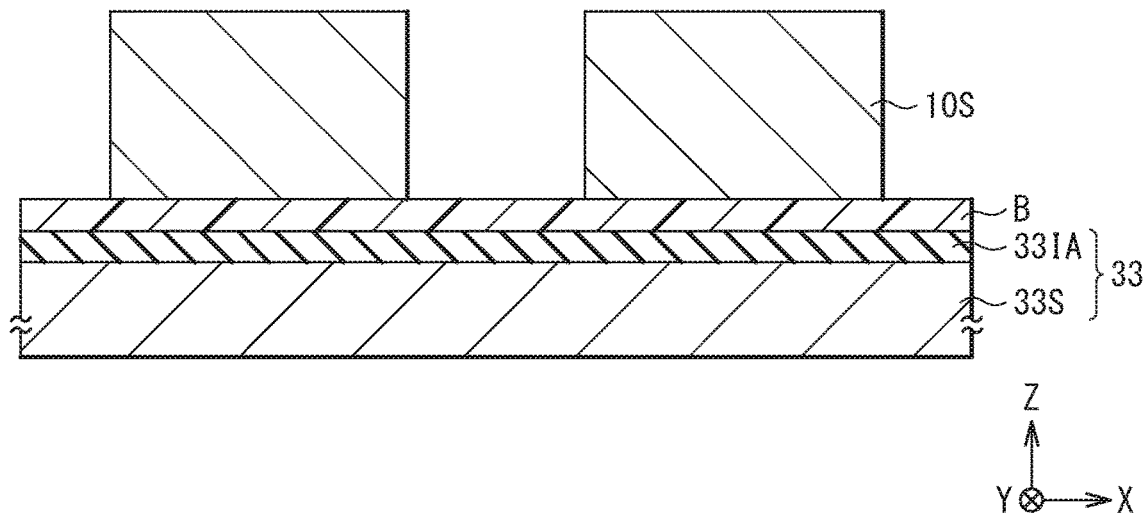
FIG. 14 is a schematic cross-sectional view of another example (2) of the step illustrated in FIG. 9B.

As illustrated in FIG. 14, the adhesive layer B may not be etched upon etching of the semiconductor layer 10S.

After the molding of the semiconductor layer 10S, the diffusion region 12A is formed in the semiconductor layer 10S for each pixel P as illustrated in FIG. 15A. This allows for element separation. For the formation of the diffusion region 12A, for example, the passivation film 17 is used as a hard mask. Specifically, the passivation film 17 is formed to cover an upper surface of the semiconductor layer 10S (a surface opposite to a bonded surface with respect to the temporary substrate 33) and a side surface thereof, and thereafter an opening is formed by etching in the passivation film 17 covering the upper surface of the semiconductor layer 10S. Thereafter, gas phase diffusion of p-type impurities is performed using the passivation film 17 as a hard mask. This allows for formation of the diffusion region 12A in a selective region. A diffusion depth is, for example, several hundred nm, and substantially isotropic diffusion is performed. The diffusion region 12A may be formed by ion implantation or the like using a resist mask. Here, the diffusion region 12A is formed in the semiconductor layer 10S provided on the temporary substrate 33 of a large bore, thus making it possible to miniaturize the pixel P.

After providing the diffusion region 12A in the semiconductor layer 10S, the first electrode 11 is formed on the semiconductor layer 10S as illustrated in FIG. 15B. For example, a stacked film of titanium (Ti)/tungsten (W) is formed in the opening provided in the passivation film 17, by means of a CVD (Chemical Vapor Deposition) method, a PVD (Physical Vapor Deposition) method, an ALD (Atomic Layer Deposition) method, a vapor deposition method, or the like, and thereafter the stacked film is patterned using photolithography and etching, to thereby form the first electrode 11.

After the formation of the first electrode 11, the embedded layer 18 is formed on the entire surface of the temporary substrate 33 as illustrated in FIG. 15C. For example, an insulating material is formed, as a film, on the entire surface of the temporary substrate 33 to embed the semiconductor layer 10S, and thereafter the insulating film is planarized by means of CMP (Chemical Mechanical Polishing) to form the embedded layer 18. This allows for formation of the embedded layer 18 covering the circumference (peripheral region R2) of the semiconductor layer 10S and the upper surface (a surface farthest from the temporary substrate 33) of the semiconductor layer 10S. In the present embodiment, the embedded layer 18 that fills a step difference between the semiconductor layer 10S and the temporary substrate 33 is formed, thus suppressing occurrence of a defect in the manufacturing step due to the level difference, although detailed description is given later.

After the formation of the embedded layer 18, the wiring layer 10W is formed, which is opposed to the semiconductor layer 10S with the embedded layer 18 interposed therebetween, as illustrated in FIG. 15D. For example, the interlayer insulating film 19A and the interlayer insulating film 19B are formed in this order on the embedded layer 18, and thereafter an opening is formed in a region, of the interlayer insulating films 19A and 19B, facing the first electrode 11. A copper (Cu) film is formed in the opening of the interlayer insulating films 19A and 19B by means of a vapor deposition method, a PVD method, a plating method, or the like, and thereafter a surface of the copper film is polished by means of a CMP method, for example, to form the contact electrode 19E. For example, the dummy electrode 19ED (FIG. 1B) is formed in the peripheral region R2 in the same step as the step of forming the contact electrode 19E. Here, the wiring layer 10W is formed over the temporary substrate 33 of a large bore, thus making it possible to use various devices for a substrate of a large bore.

Figure 15E:
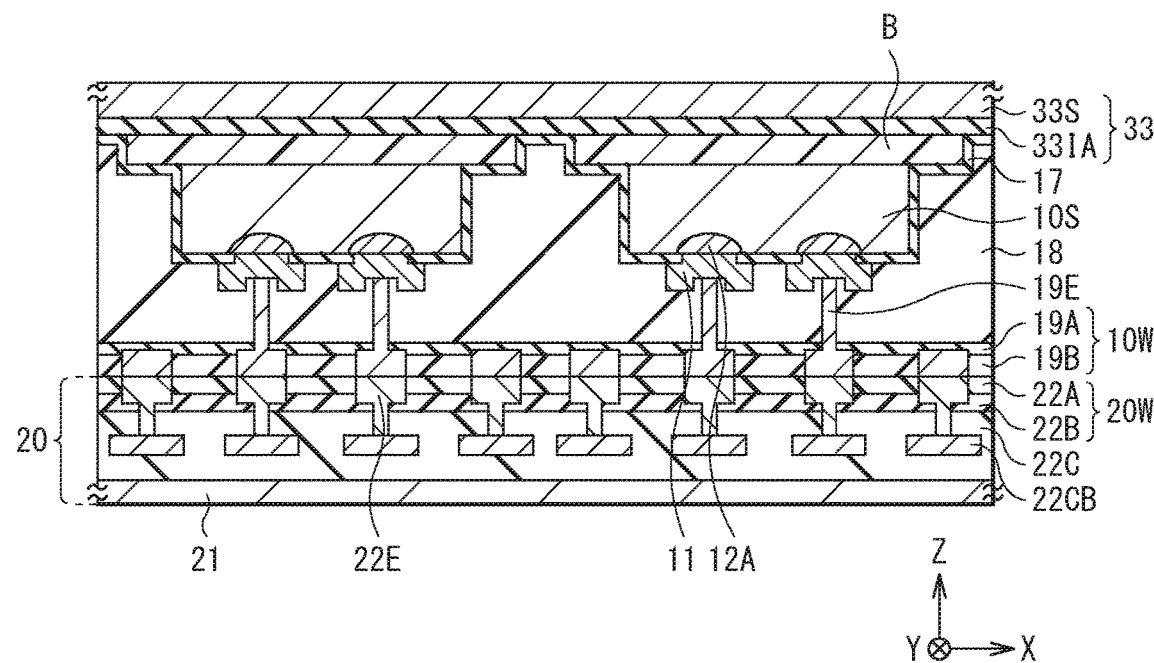
FIG. 15E is a schematic cross-sectional view of a step subsequent to FIG. 15D.

After the formation of the wiring layer 10W, the readout circuit substrate 20 is bonded to the temporary substrate 33 with the wiring layer 10W interposed therebetween, as illustrated in FIG. 15E. At this time, the wiring layer 20W is formed in advance in the readout circuit substrate 20. The wiring layer 20W of the readout circuit substrate 20 includes the contact electrode 22E and the dummy electrode 22ED; when attaching the readout circuit substrate 20 to the temporary substrate 33, for example, Cu—Cu bonding is established between the contact electrode 22E as well as the dummy electrode 22ED of the wiring layer 20W and the contact electrode 19E as well as the dummy electrode 19ED of the wiring layer 10W. More specifically, the bonded surface S2 at which the contact electrode 19E and the contact electrode 22E are bonded to each other is formed in the element region R1, and the bonded surface S2 at which the dummy electrode 19ED and the dummy electrode 22ED are bonded to each other is formed in the peripheral region R2. Here, the peripheral region R2 of the element substrate 10 is also bonded to the readout circuit substrate 20.

Figure 15F:
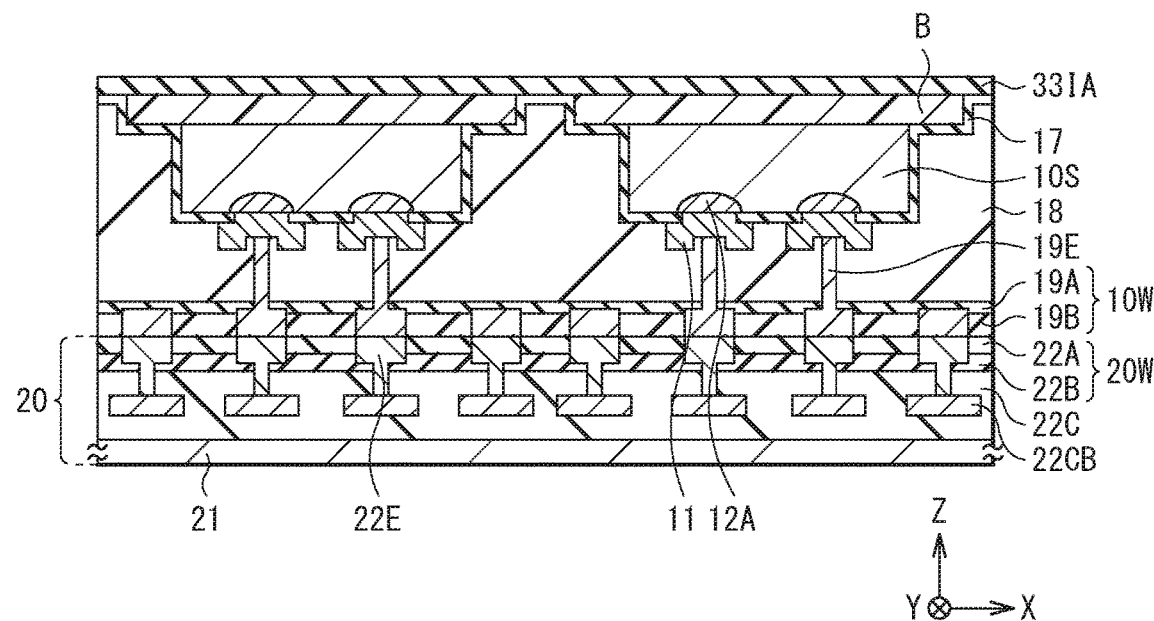
FIG. 15F is a schematic cross-sectional view of a step subsequent to FIG. 15E.

After the attachment of the readout circuit substrate 20 to the temporary substrate 33, the temporary substrate 33 is removed as illustrated in FIG. 15F. The temporary substrate 33 may be removed by using, for example, mechanical grinding, wet etching, dry etching, or the like.

Figure 15G:
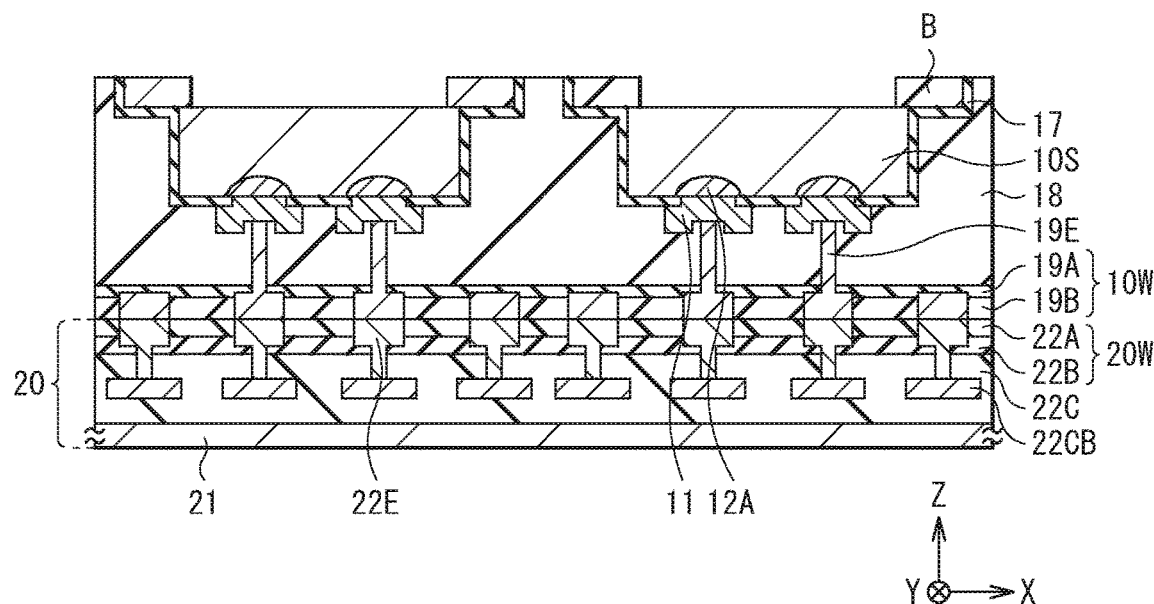
FIG. 15G is a schematic cross-sectional view of a step subsequent to FIG. 15F.

After the removal of the temporary substrate 33, the adhesive layer B or the like is also removed to expose a surface of the semiconductor layer 10S as illustrated in FIG. 15G. At this time, an unnecessary layer of the semiconductor layer 10S may be removed. In addition, a portion of the insulating layer 33IA or the passivation film 17 other than the opening of the semiconductor layer 10S may remain, or the embedded layer 18 may be dug halfway.

Figure 15H:
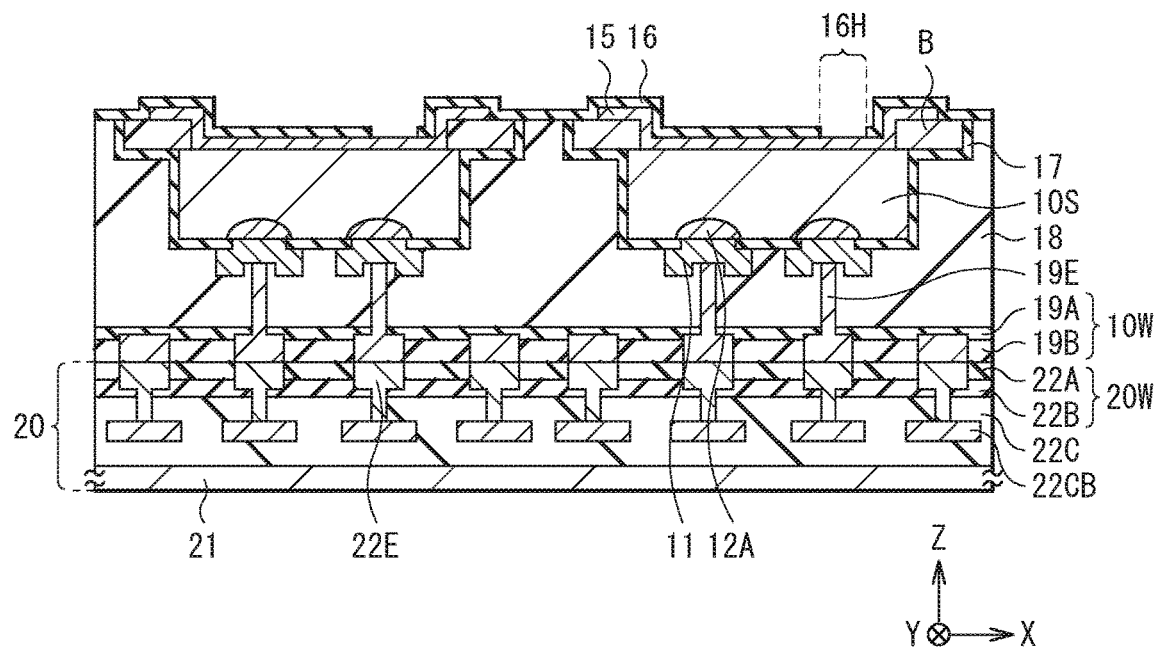
FIG. 15H is a schematic cross-sectional view of a step subsequent to FIG. 15G.
Figure 15I:
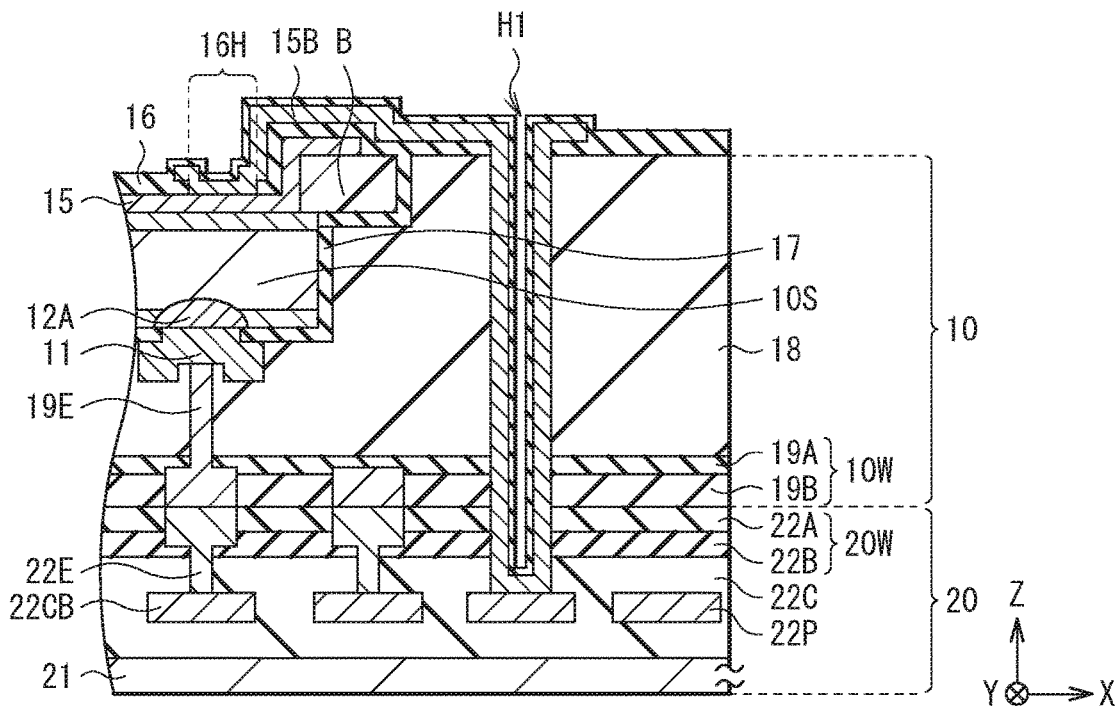
FIG. 15I is a schematic cross-sectional view of a step subsequent to FIG. 15H.

Subsequently, as illustrated in FIG. 15H, the second electrode 15 and the passivation film 16 are formed in this order on a surface of the semiconductor layer 10S exposed by the removal of the temporary substrate 33 (a surface opposite to the surface provided with the wiring layer 10W). Thereafter, as illustrated in FIG. 15I, the hole H1 and the electrically-conductive film 15B are formed. This allows the second electrode 15 and the readout circuit substrate 20 to be electrically coupled to each other.

Figure 15J:
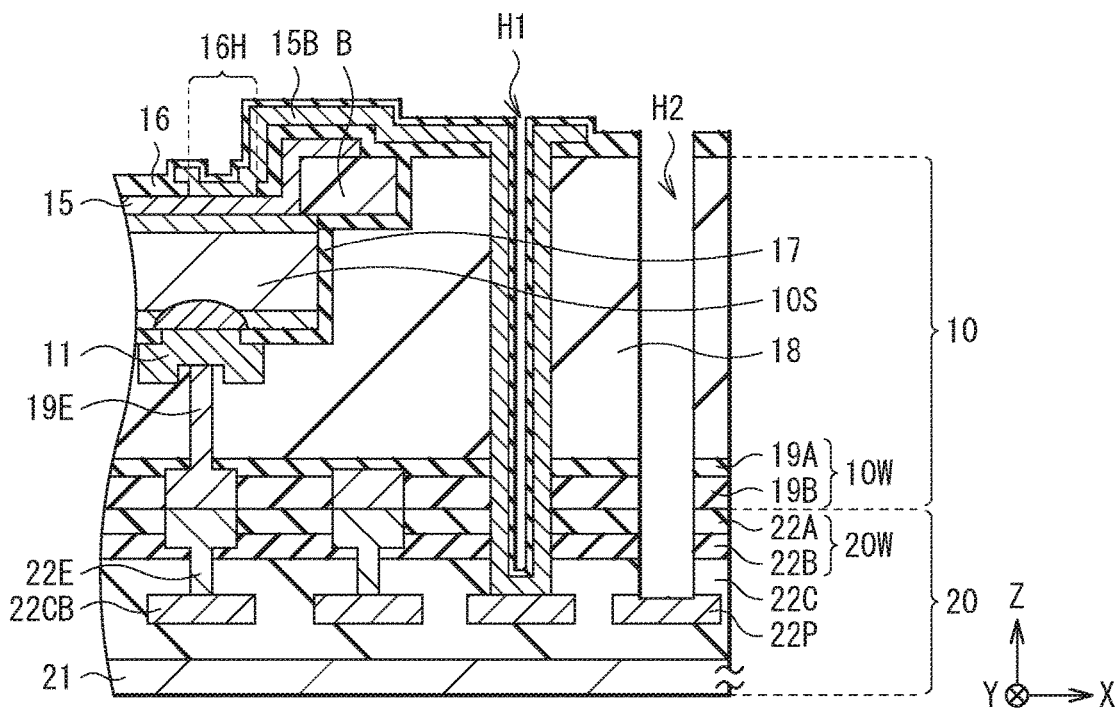
FIG. 15J is a schematic cross-sectional view of a step subsequent to FIG. 15I.

Finally, as illustrated in FIG. 15J, the hole H2 is formed, which penetrates the element substrate 10 to reach the pad electrode 22P of the readout circuit substrate 20. This completes the light-receiving element 1 illustrated in FIGS. 1A and 1B.

[Operation of Light-Receiving Element 1]

In the light-receiving element 1, when light (e.g., light beams of wavelengths in a visible region and an infrared region) enters the photoelectric conversion layer 13 via the passivation film 16, the second electrode 15, and the second contact layer 14, the light is absorbed in the photoelectric conversion layer 13. This generates pairs of holes (holes) and electrons (photoelectrical conversion is performed) in the photoelectric conversion layer 13. At this time, for example, when a predetermined voltage is applied to the first electrode 11, a potential gradient occurs in the photoelectric conversion layer 13, and one (e.g., holes) of generated charges move as signal charges to the diffusion region 12A to be collected to the first electrode 11 from the diffusion region 12A. The signal charges move to the semiconductor substrate 21 through the contact electrodes 19E and 22E to be read for each pixel P.

[Workings and Effects of Light-Receiving Element 1]

The light-receiving element 1 of the present embodiment includes the passivation film 17 provided between the semiconductor layer 10S and the wiring layer 10W, and the passivation film 16 opposed to the passivation film 17 with the semiconductor layer 10S interposed therebetween.

In a case where an insulating film having no passivation function is provided between the semiconductor layer 10S and the wiring layer 10W and only the side of the light incident surface S1 of the semiconductor layer 10S is covered with the passivation film 16, there is a possibility that the semiconductor layer 10S may not be sufficiently protected. For example, upon infiltration of moisture into the semiconductor layer 10S from the outside, reliability of the light-receiving element is lowered.

In contrast, in the present embodiment, both surfaces of the semiconductor layer 10S (a surface on side of the bonding surface S2 and a surface on the side of the light incident surface S1) are covered with the passivation films 16 and 17, thus allowing the semiconductor layer 10S to be effectively protected. This makes it possible to suppress an influence on the semiconductor layer 10S from the outside and thus to suppress the lowering in the reliability of the light-receiving element 1.

In addition, in the light-receiving element 1, the passivation film 17 covers the end surfaces of the respective layers of the semiconductor layer 10S continuously from the surface of the semiconductor layer 10S on the side of the bonded surface S2, thus making it possible to more effectively protect the semiconductor layer 10S. Further, the passivation film 17 is in contact with the passivation film 16 in the peripheral region R2, thus allowing almost all the surfaces of the semiconductor layer 10S to be covered with the passivation films 16 and 17. This makes it possible to protect the semiconductor layer 10S more effectively.

In addition, the light-receiving element 1 of the present embodiment includes the embedded layer 18 in the peripheral region R2 of the element substrate 10, and the peripheral region R2 is also provided with the bonded surface S2 with respect to the readout circuit substrate 20. The embedded layer 18 serves to fill the step difference between the semiconductor layer 10S and the temporary substrate 33 when forming the light-receiving element 1. Forming the embedded layer 18 makes it possible to suppress the occurrence of a defect in the manufacturing step due to the step difference between the semiconductor layer 10S and the temporary substrate 33. This is described below.

Types of the growth substrate 31 for epitaxially growing the semiconductor layer 10S is limited. For example, there is no growth substrate of a large bore as the growth substrate 31 for growing the photoelectric conversion layer 13 including InGaAs. In a case of using the growth substrate 31 of a small bore to form the diffusion region 12A for each pixel P or to form the wiring layer 10W, it is difficult to perform miniaturization of the pixel P from the constraint of the device or the like. For this reason, a method of manufacturing a light-receiving element using the temporary substrate 33 of a large bore is conceivable.

However, when manufacturing the light-receiving element without forming an embedded layer (embedded layer 18 in FIG. 15C), the wiring layer 10W is formed on the semiconductor layer 10S, in a state where a large step difference exists between the temporary substrate 33 and the semiconductor layer 10S. Accordingly, there is a possibility that defocusing may occur in photolithography upon formation of the wiring layer 10W. In addition, when forming the contact electrode 19E by performing CMP on a copper film, the copper may remain in the step difference part. Further, the existence of the step difference may possibly cause a bonding defect upon the attachment of the readout circuit substrate 20 to the temporary substrate 33.

In contrast, in the light-receiving element 1, the formation of the embedded layer 18 reduces or eliminates the step difference between the semiconductor layer 10S and the temporary substrate 33, and thereafter the wiring layer 10W is formed, thus making it possible to suppress the above-described occurrence of a defect during the manufacture of the light-receiving element due to the step difference. This enables the manufacture using various devices for a substrate of a large bore without being influenced by the size of the growth substrate 31, thus making it possible to perform miniaturization or the like of the pixel.

In addition, it is possible, in the light-receiving element 1, to form the hole H1 (or groove G) for coupling the second electrode 15 and the readout circuit substrate 20 to each other, in the embedded layer 18 of the peripheral region R2. This allows for electrical coupling between the second electrode 15 and the readout circuit substrate 20 without providing the hole H1 in the semiconductor layer 10S. In addition, it is possible to easily form the hole H1 in the embedded layer 18 including an insulating material by using an existing technique.

Further, the embedded layer 18 is able to cover the end surface of the semiconductor layer 10S with sufficient thickness, thus suppressing the infiltration of moisture into the semiconductor layer 10S. This makes it possible to suppress deterioration of the semiconductor layer 10S.

As has been described above, the light-receiving element 1 of the present embodiment is provided with the passivation film 17 and the passivation film 16 that are opposed to each other with the semiconductor layer 10S interposed therebetween, thus making it possible to effectively protect the semiconductor layer 10S. This makes it possible to protect the semiconductor layer 10S and thus to suppress the lowering in the reliability.

In addition, the embedded layer 18 is formed in the light-receiving element 1, thus making it possible to suppress the occurrence of a defect in the manufacturing step due to the step difference between the semiconductor layer 10S and the temporary substrate 33. This enables the manufacture without being influenced by the size of the growth substrate 31 for forming the semiconductor layer 10S, thus making it possible to perform miniaturization of the pixel P, for example. In the light-receiving element 1, providing the embedded layer 18 allows for formation of the bonded surface S2 with respect to the readout circuit substrate 20 also in the peripheral region R2 of the element substrate 10.

In addition, molding the semiconductor layer 10S to have a chip shape of a predetermined size on the temporary substrate 33 prior to the formation of the embedded layer 18 makes it possible to suppress occurrence of misalignment in a subsequent step and thus to easily form the light-receiving element 1 in a desired structure.

Further, the element substrate 10 and the readout circuit substrate 20 are coupled to each other by means of Cu—Cu bonding between the contact electrodes 19E and 22E, thereby making it possible to miniaturize the pixel P. This is described below.

There have been proposed methods of coupling an element substrate including a compound semiconductor and a readout circuit substrate including a readout circuit to each other using a solder bump, an indium bead, or the like. In a case where these coupling means are used, a diameter of a bump or a bead formed in an assembling step of semiconductor devices and a length of one side of an electrode pad that brings these parts into contact are, for example, several dozen μm or 100 μm or more. Meanwhile, when using the Cu—Cu bonding, a length of one side of the Cu pad formed in the wafer step of the semiconductor device is several μm. Thus, in the light-receiving element 1, the size of each of the contact electrodes 19E and 22E provided for each pixel P is reduced to about ⅒ of the solder bump or the like. This makes it possible to reduce the size of the pixel P Hereinafter, description is given of modification examples of the foregoing embodiment and another embodiment; however, in the following description, the same constituent parts as those of the foregoing embodiment are denoted by the same reference numerals, and descriptions thereof are omitted where appropriate.

Modification Example 1

Figure 16:
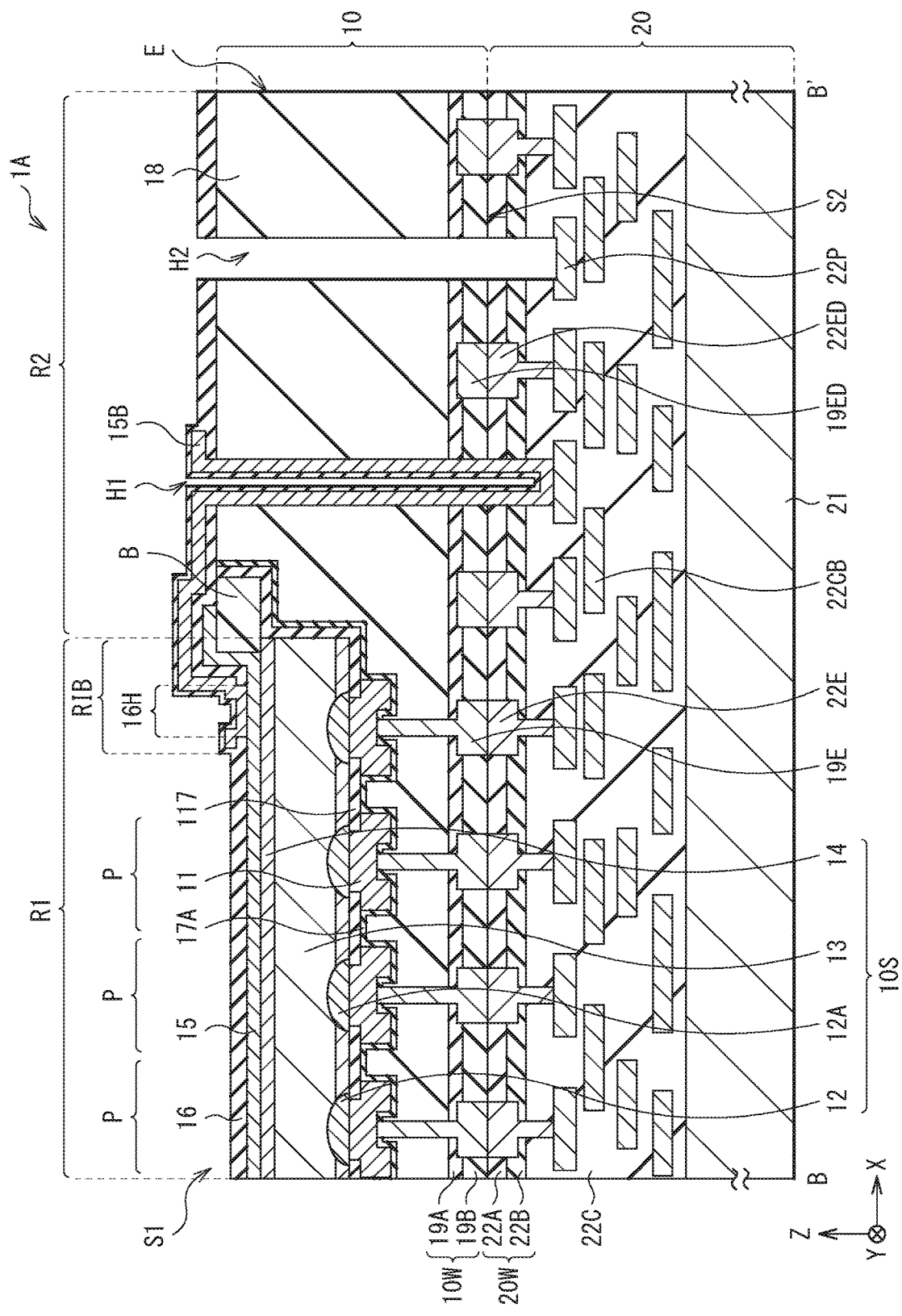
FIG. 16 is a schematic cross-sectional view of an outline configuration of a light-receiving element according to Modification Example 1.

FIG. 16 illustrates a cross-sectional configuration of a main part of a light-receiving element (a light-receiving element 1A) according to Modification Example 1 of the foregoing first embodiment. The light-receiving element 1A includes a passivation film (a passivation film 17A) covering the first electrode 11 and the semiconductor layer 10S. In other words, the first electrode 11 is provided between the semiconductor layer 10S and the passivation film 17A. Except for this point, the light-receiving element 1A has configurations and effects similar to those of the light-receiving element 1.

The light-receiving element 1A includes an insulating film 117 instead of the passivation film 17 of the light-receiving element 1. The insulating film 117 is in contact with the semiconductor layer 10S, and covers a surface of the bonded surface S2 on side of the semiconductor layer 10S and end surfaces of respective layers of the semiconductor layer 10S. The insulating film 117 may not have the passivation function.

The passivation film 17A is provided in contact with the first electrode 11 and the insulating film 117, for example. The passivation film 17A is provided between the first electrode 11 or the insulating film 117 and the wiring layer 10W in the element region R1, and is provided between the embedded layer 18 of the peripheral region R2 and the insulating film 117. That is, the passivation film 17A covers the surface of the semiconductor layer 10S opposed to the wiring layer 10W and the end surfaces of the respective layers of the semiconductor layer 10S, with the first electrode 11 and the insulating film 117 interposed therebetween. The passivation film 17A continuously covers the surface of the semiconductor layer 10S opposed to the wiring layer 10W and the end surfaces of the respective layers of the semiconductor layer 10S, for example. The end surfaces of the respective layers of the semiconductor layer 10S are covered with the passivation film 17A around the entire circumference. The passivation film 17A is provided across the element region R1 and the peripheral region R2, and is in contact with the passivation film 16 in the peripheral region R2. Here, the passivation film 17A corresponds to a specific example of each of the "first passivation film" and the "third passivation film" of the present disclosure.

The passivation film 17A has an opening on a region facing the first electrode 11, and a wiring line for coupling the contact electrode 19E and the first electrode 11 to each other is buried in the opening of the passivation film 17A. The wiring line is constituted by, for example, an electrically-conductive metal material. In the opening of the passivation film 17A, this wiring line suppresses infiltration of moisture into the semiconductor layer 10S.

The passivation film 17A has a passivation function, and is constituted by, for example, a material similar to that described in the above-described passivation film 17. The passivation film 17A has a thickness of, for example, about 100 nm to about 200 nm.

Such a passivation film 17A is formed, for example, as follows. First, in the same manner as described in the foregoing first embodiment, the semiconductor layer 10S, the insulating film 117, and the first electrode 11 are formed (FIG. 15B). At this time, the insulating film 117 is used as a hard mask to form the diffusion region 12A.

Figure 17:
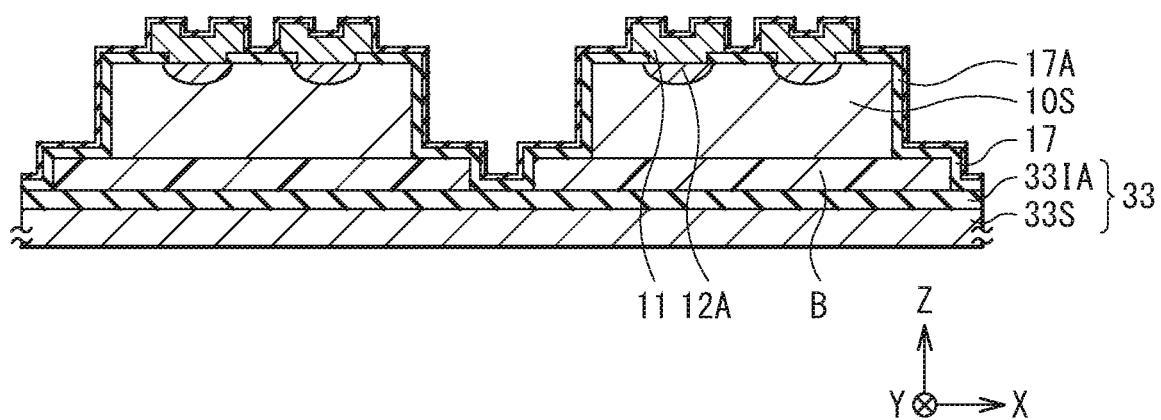
FIG. 17 is a schematic cross-sectional view for describing one step of a method of manufacturing the light-receiving element illustrated in FIG. 16.

Next, as illustrated in FIG. 17, the passivation film 17A is formed to cover an upper surface and a side surface of the semiconductor layer 10S, with the first electrode 11 and the insulating film 117 interposed therebetween. Thereafter, a method similar to that described in the foregoing first embodiment is used to form the embedded layer 18, the wiring layer 10W, and the like, thus enabling formation of the light-receiving element 1A.

Here, the passivation film 17A is provided between the embedded layer 18 and the first electrode 11, and thus the passivation film 17A functions as a stopper for planarization processing of the embedded layer 18 when performing the planarization processing, thus enabling prevention of excessive polishing. In addition, the passivation film 17A also functions as a stopper in a via (via) process when coupling the contact electrode 19E to the first electrode 11.

As in the present modification example, the passivation film 17A provided on the semiconductor layer 10S on the side of the bonded surface S2 may cover the first electrode 11 and the semiconductor layer 10S. Also in this case, it is possible to obtain effects similar to those of the foregoing first embodiment.

Modification Example 2

Figure 18:
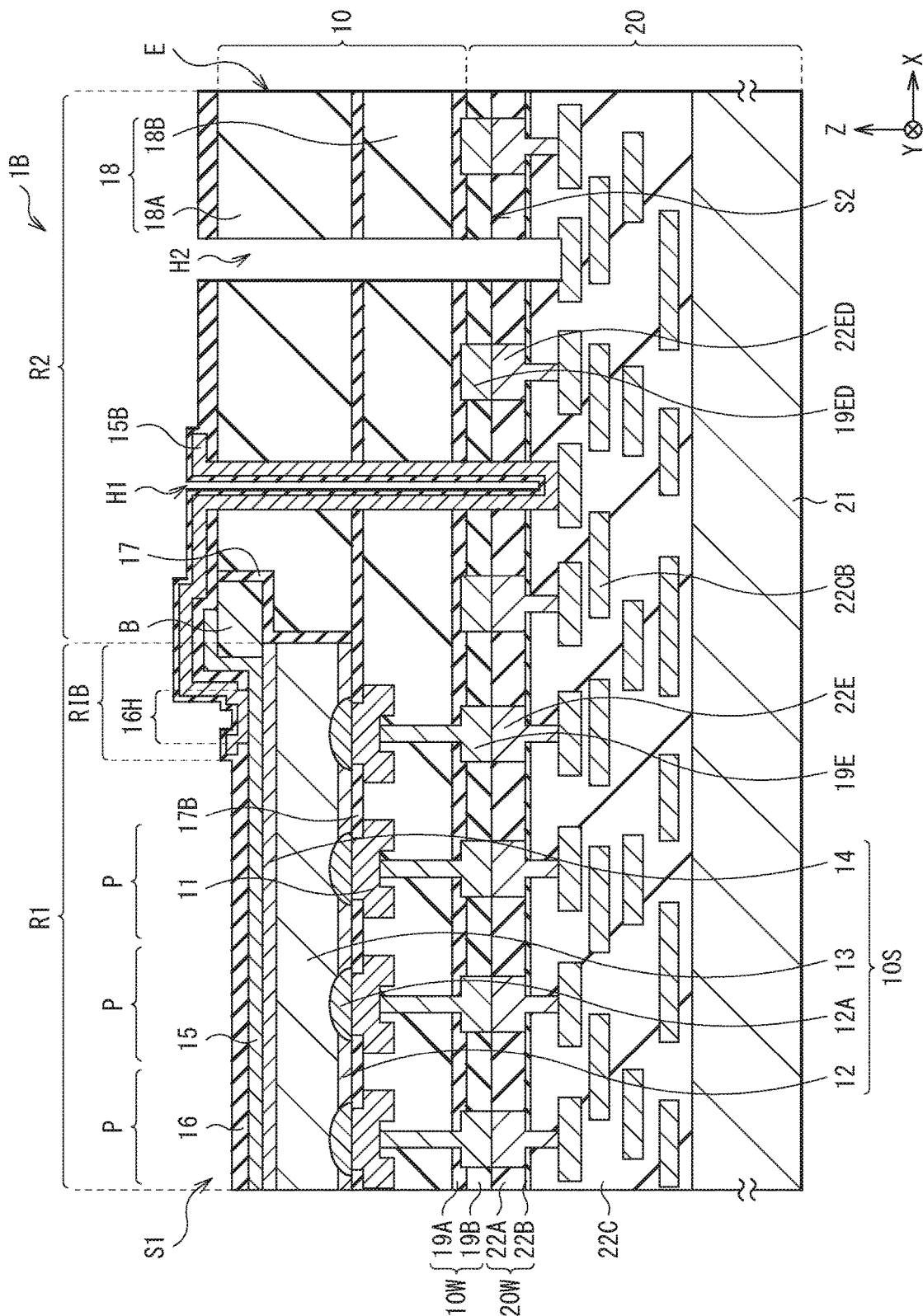
FIG. 18 is a schematic cross-sectional view of an outline configuration of a light-receiving element according to Modification Example 2.
Figure 19:
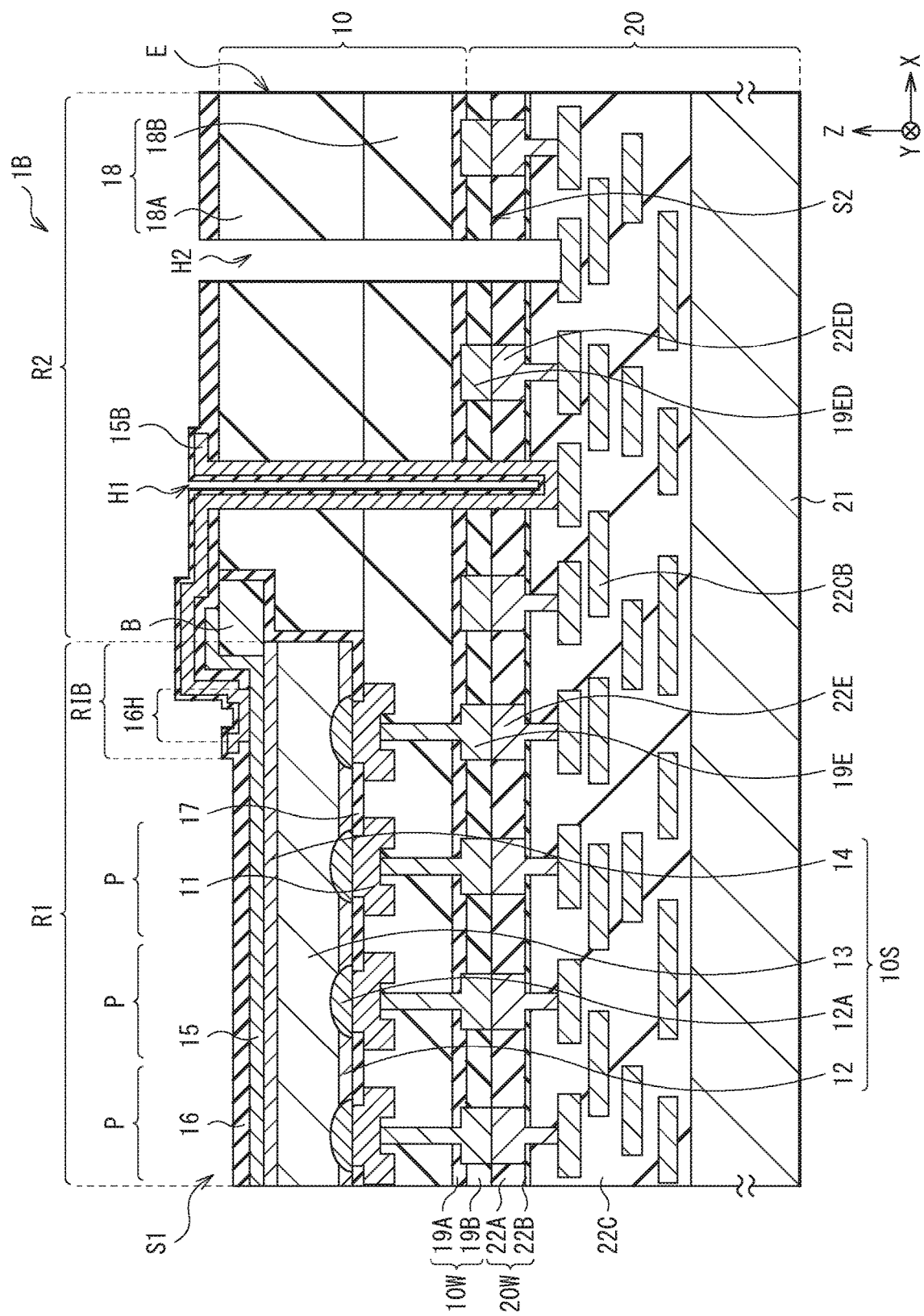
FIG. 19 is a schematic cross-sectional view of another example (1) of the light-receiving element illustrated in FIG. 18.
Figure 20:
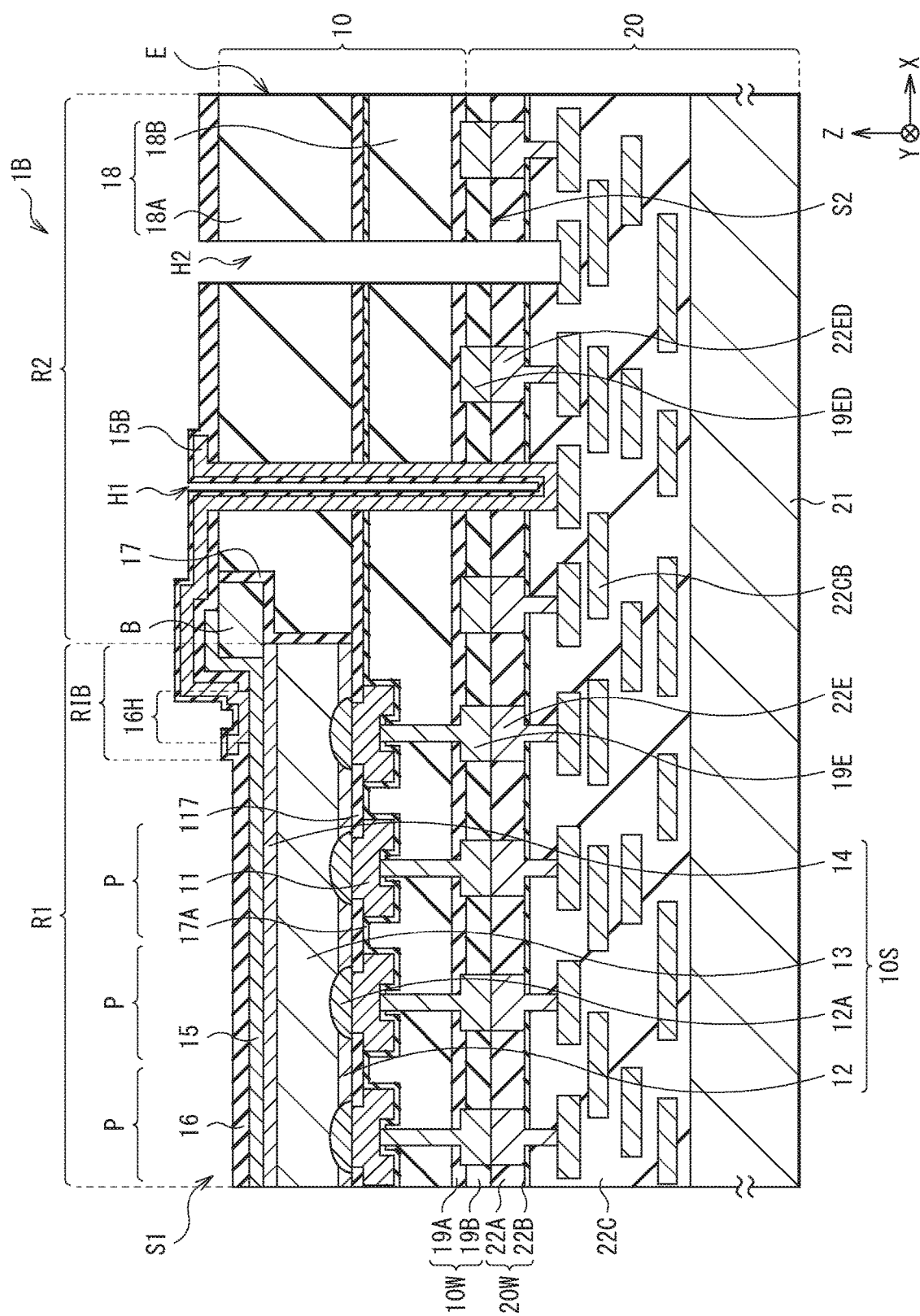
FIG. 20 is a schematic cross-sectional view of another example (2) of the light-receiving element illustrated in FIG. 18.

FIGS. 18, 19 and 20 each illustrate a cross-sectional configuration of a main part of a light-receiving element (a light-receiving element 1B) according to Modification Example 2 of the foregoing first embodiment. In the light-receiving element 1B, the embedded layer 18 includes a first embedded layer 18A and a second embedded layer 18B that are stacked. Except for this point, the light-receiving element 1B has configurations and effects similar to those of the light-receiving element 1.

The first embedded layer 18A is disposed in the peripheral region R2, and is provided closer to the side of the light incident surface S1 than the second embedded layer 18B. Specifically, the first embedded layer 18A is disposed between the second embedded layer 18B and the passivation film 16, and covers an end surface of the semiconductor layer 10S.

The second embedded layer 18B is provided across the element region R1 and the peripheral region R2. The second embedded layer 18B of the element region R1 is disposed between the wiring layer 10W and the semiconductor layer 10S, and covers a lower surface and a side surface of the first electrode 11 as well as a lower surface of the semiconductor layer 10S (a surface on the side of the bonded surface S2). The second embedded layer 18B of the peripheral region R2 is disposed between the wiring layer 10W and the first embedded layer 18A. A constituent material of the first embedded layer 18A and a constituent material of the second embedded layer 18B may be the same or different. A thickness of the first embedded layer 18A and a thickness of the second embedded layer 18B may be the same or different.

As illustrated in FIG. 18, for example, a passivation film (a passivation film 17B) is provided between the first embedded layer 18A and the second embedded layer 18B.

The passivation film 17B is provided on a substantially identical plane across the element region R1 and the peripheral region R2. The passivation film 17B is disposed between the semiconductor layer 10S and the second embedded layer 18B in the element region R1, and is disposed between the first embedded layer 18A and the second embedded layer 18B in the peripheral region R2. The passivation film 17B is in contact with the first contact layer 12, and covers a surface of the semiconductor layer 10S opposed to the wiring layer 10W. The passivation film 17B has a plurality of openings on regions facing the first contact layer 12, and the first electrode 11 is buried in each of the plurality of openings.

The passivation film 17B has a passivation function, and is constituted by, for example, a material similar to that described in the above-described passivation film 17. The passivation film 17B has a thickness of, for example, about 100 nm to about 200 nm.

The surface of the semiconductor layer 10S on the side of the bonded surface S2 is covered with such a passivation film 17B, and end surfaces of respective layers of the semiconductor layer 10S are covered with the passivation film 17, for example. Similarly to the light-receiving element 1, the passivation film 17 is provided in contact with, for example, the semiconductor layer 10S, and is in contact with the passivation film 16 in the peripheral region R2. The passivation film 17B and the passivation film 17 are in contact with each other, and the surface of the semiconductor layer 10S on the side of the bonded surface S2 and the end surfaces of the respective layers of the semiconductor layer 10S are covered with the passivation films 17 and 17B without a gap. Here, the passivation film 17B corresponds to a specific example of the "first passivation film" of the present disclosure, and the passivation film 17 corresponds to a specific example of the "third passivation film" of the present disclosure As illustrated in FIG. 19, the surface of the semiconductor layer 10S on the side of the bonded surface S2 and the end surfaces of the respective layers of the semiconductor layer 10S may be covered with the passivation film 17. Similarly to the light-receiving element 1, the passivation film 17 continuously covers the surface of the semiconductor layer 10S on the side of the bonded surface S2 and the end surfaces of the respective layers of the semiconductor layer 10S.

As illustrated in FIG. 20, the surface of the semiconductor layer 10S on the side of the bonded surface S2 may be covered with the passivation film 17A together with the first electrode 11. Similarly to the light-receiving element 1B, the passivation film 17A is provided in contact with, for example, the first electrode 11 and the insulating film 117. The passivation film 17A is provided between the first embedded layer 18A and the second embedded layer 18B together with the insulating film 117, for example, and extends from the element region R1 to the peripheral region R2. The end surfaces of the respective layers of the semiconductor layer 10S are covered with the passivation film 17, for example.

Such a light-receiving element 1B may be manufactured, for example, as follows.

First, in the same manner as described in the foregoing first embodiment, the semiconductor layer 10S on the temporary substrate 33 is molded to have a shape of a plurality of chips (FIG. 9B).

Figure 21:
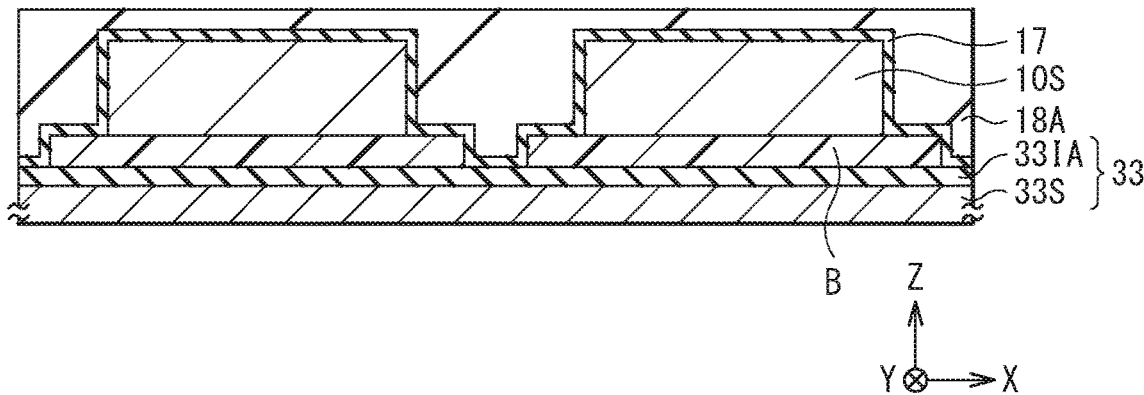
FIG. 21 is a schematic cross-sectional view for describing one step of a method of manufacturing the light-receiving element illustrated in FIG. 18, etc.

Next, as illustrated in FIG. 21, the passivation film 17 and the first embedded layer 18A are formed in this order on the entire surface of the temporary substrate 33. The passivation film 17 is formed on the entire surface of the temporary substrate 33 to cover an upper surface and a side surface of the semiconductor layer 10S. For example, an insulating material is formed, as a film, on the entire surface of the temporary substrate 33 to embed the semiconductor layer 10S, and thereafter the insulating material is planarized by means of CMP to form first embedded layer 18A. The planarization may be performed to allow the first embedded layer 18A to remain immediately above the semiconductor layer 10S, or may be performed until the passivation film 17 on the semiconductor layer 10S is exposed. This allows for formation of the passivation film 17 covering the upper surface and the side surface of the semiconductor layer 10S and the first embedded layer 18A covering the circumference of the semiconductor layer 10S with the passivation film 17 interposed therebetween.

Here, the passivation film 17 is provided between the first embedded layer 18A and the semiconductor layer 10S, and thus the passivation film 17 functions as a stopper for planarization processing of the first embedded layer 18A, for example, when performing the planarization processing, thus enabling prevention of excessive polishing.

Figure 22:
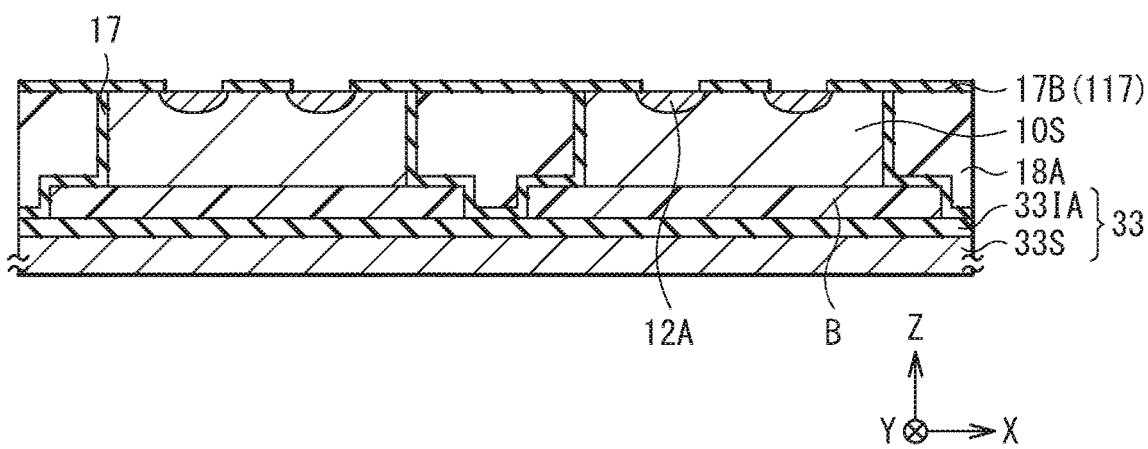
FIG. 22 is a schematic cross-sectional view of a step subsequent to FIG. 21.
Figure 23:
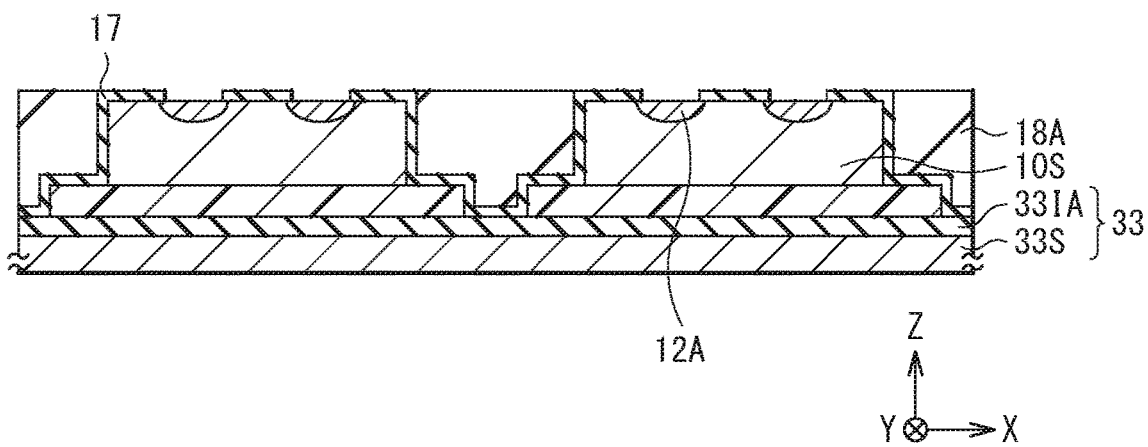
FIG. 23 is a schematic cross-sectional view of another example of a step subsequent to FIG. 21.

After the formation of the first embedded layer 18A, the diffusion region 12A is formed as illustrated in FIGS. 22 and 23. For example, a mask formed by the passivation film 17B or the insulating film 117 is used to form the diffusion region 12A, as illustrated in FIG. 22. The first embedded layer 18A immediately above the semiconductor layer 10S is removed, and the semiconductor layer 10S (first contact layer 12) is exposed; thereafter the passivation film 17B or the insulating film 117 is formed to cover the semiconductor layer 10S. Alternatively, as illustrated in FIG. 23, a mask formed by the passivation film 17 may be used to form the diffusion region 12A.

Figure 24A:
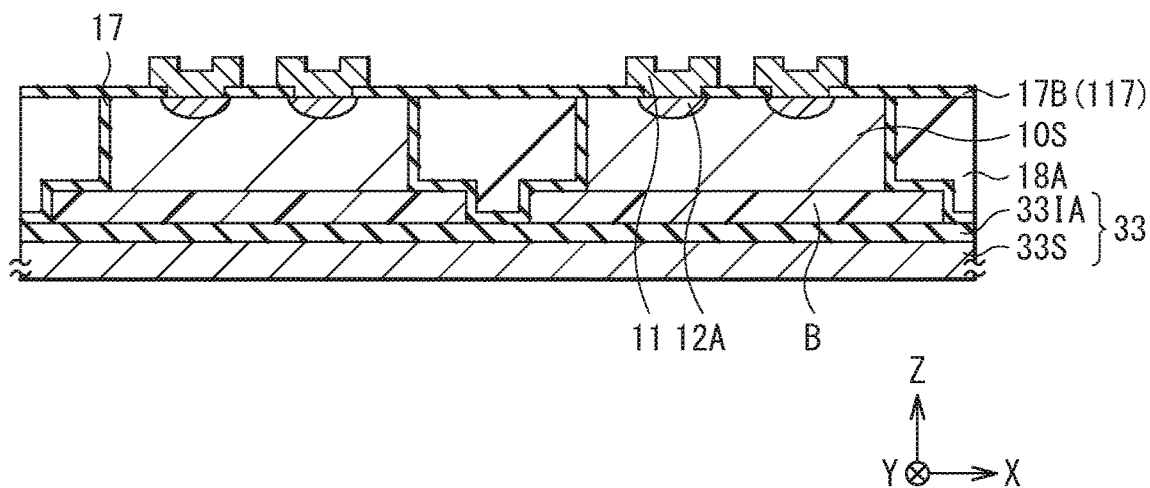
FIG. 24A is a schematic cross-sectional view of a step subsequent to FIG. 22.

After the formation of the diffusion region 12A in the semiconductor layer 10S, the first electrode 11 is formed in an opening of the passivation film 17B or the insulating film 117, as illustrated in FIG. 24A. The first electrode 11 may be formed in an opening (FIG. 23) of the passivation film 17, although illustration is omitted.

Figure 24B:
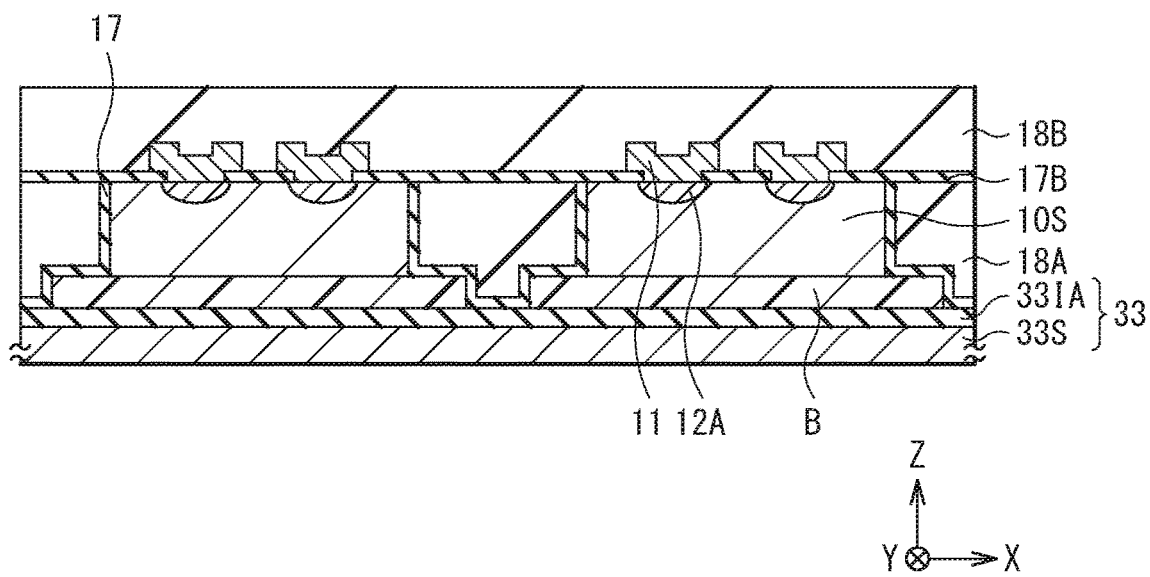
FIG. 24B is a schematic cross-sectional view of a step subsequent to FIG. 24A.

After the formation of the first electrode 11, the second embedded layer 18B is formed over the first embedded layer 18A to cover the first electrode 11 as illustrated in FIG. 24B. An insulating material is formed, as a film, on the entire surface of the temporary substrate 33, and thereafter the insulating material is planarized by means of CMP to form the second embedded layer 18B.

The passivation film 17A may be formed prior to the formation of the second embedded layer 18B (see FIG. 17). In the same manner as described in the foregoing Modification Example 1, the passivation film 17A functions as a stopper upon the planarization processing or the like of the second embedded layer 18B.

After the formation of the second embedded layer 18B, it is possible to complete the light-receiving element 1B through steps similar to those described in the foregoing first embodiment (FIGS. 15D, 15E, 15F, 15G, 15H, 15I, and 15J).

The embedded layer 18 may be configured by a stacked structure of the first embedded layer 18A and the second embedded layer 18B as in the present modification example. Also in this case, it is possible to obtain effects similar to those of the foregoing first embodiment.

Modification Example 3

Figure 25:
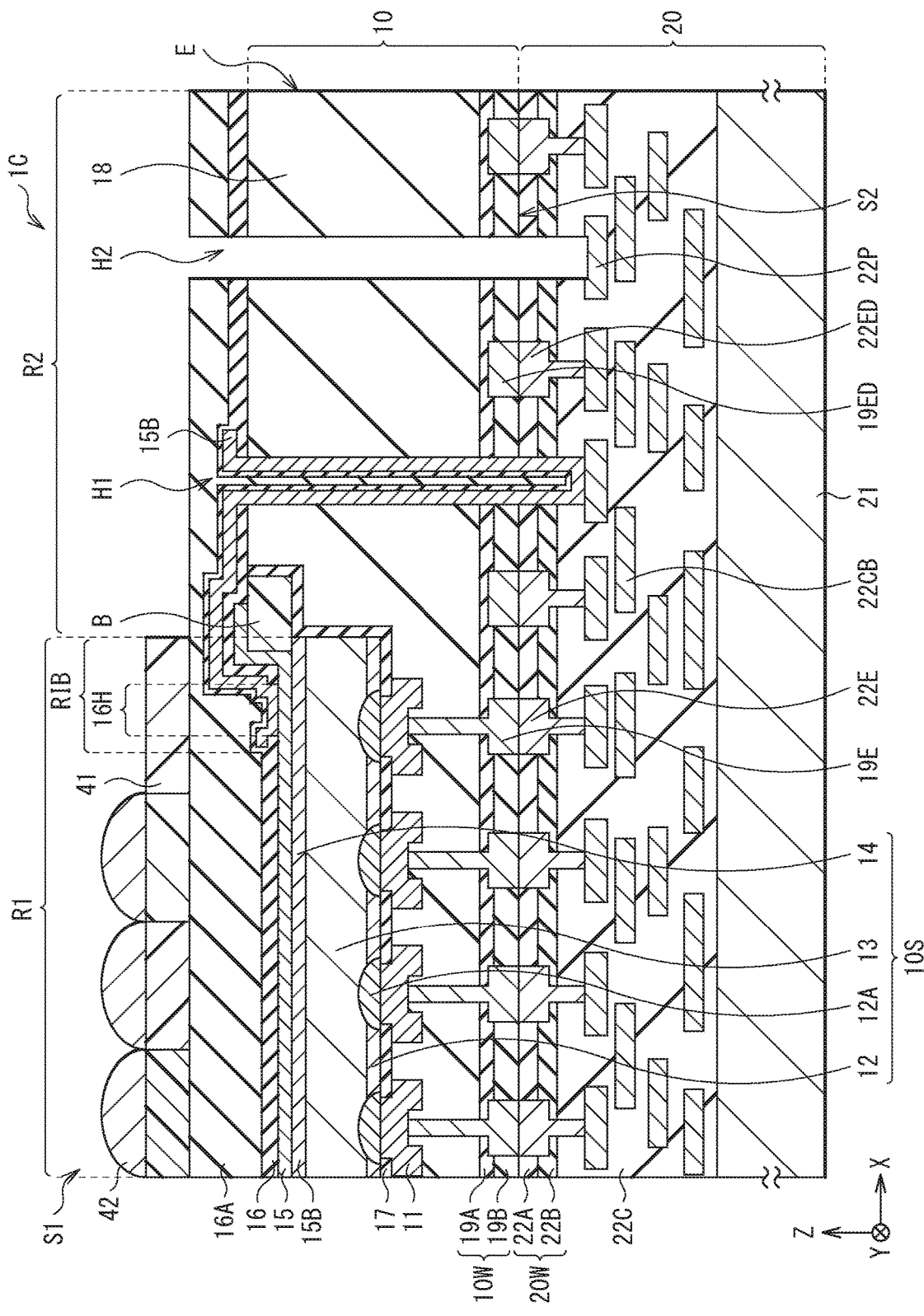
FIG. 25 is a schematic cross-sectional view of an outline configuration of a light-receiving element according to Modification Example 3.

FIG. 25 illustrates a cross-sectional configuration of a main part of a light-receiving element (a light-receiving element 1C) according to Modification Example 3 of the foregoing first embodiment. The light-receiving element 1C includes a color filter layer 41 and an on-chip lens (condenser lenses) 42 on the light incident surface S1 of the element substrate 10 (a surface opposite to the surface facing the readout circuit substrate 20). Except for this point, the light-receiving element 1C has configurations and effects similar to those of the light-receiving element 1. The light-receiving element 1A and the light-receiving element 1B may each include the color filter layer 41 and the on-chip lens 42.

For example, in the light-receiving element 1C, the color filter layer 41 and the on-chip lens 42 are provided in this order on the passivation film 16 of the element substrate 10, with a planarization film 16A interposed therebetween. The color filter layer 41 may include an IR (Infrared) filter. Providing the color filter layer 41 makes it possible to obtain data on light reception of a corresponding wavelength for each pixel P.

The on-chip lens 42 serves to condense light having entered the light-receiving element 1C to the photoelectric conversion layer 13. The on-chip lens 42 is constituted by, for example, an organic material, silicon oxide ($SiO_2$), or the like. In the light-receiving element 1C, the embedded layer 18 is provided in the peripheral region R2, and thus a step difference between the element region R1 and the peripheral region R2 of the element substrate 10 is reduced or eliminated, thus allowing for formation of the light incident surface S1 that is planar. This enables formation of the on-chip lens 42 with high accuracy by using a photolithography step, for example. For example, the color filter layer 41 and the on-chip lens 42 are terminated in the element region R1. The planarization film 16A disposed between the passivation film 16 and the color filter layer 41 is provided, for example, from the element region R1 to the peripheral region R2, and is terminated in the peripheral region R2. The color filter layer 41, the on-chip lens 42, and the planarization film 16A may each be terminated at any position within the element region R1 or within the peripheral region R2.

As in the present modification example, the color filter layer 41 and the on-chip lens 42 may be provided on the light incident surface S1 of the element substrate 10. Also in this case, it is possible to obtain effects similar to those of the foregoing first embodiment. In addition, it is possible to easily form the on-chip lens 42 with high accuracy on the light incident surface S1 planarized by the embedded layer 18.

Second Embodiment

Figure 26:
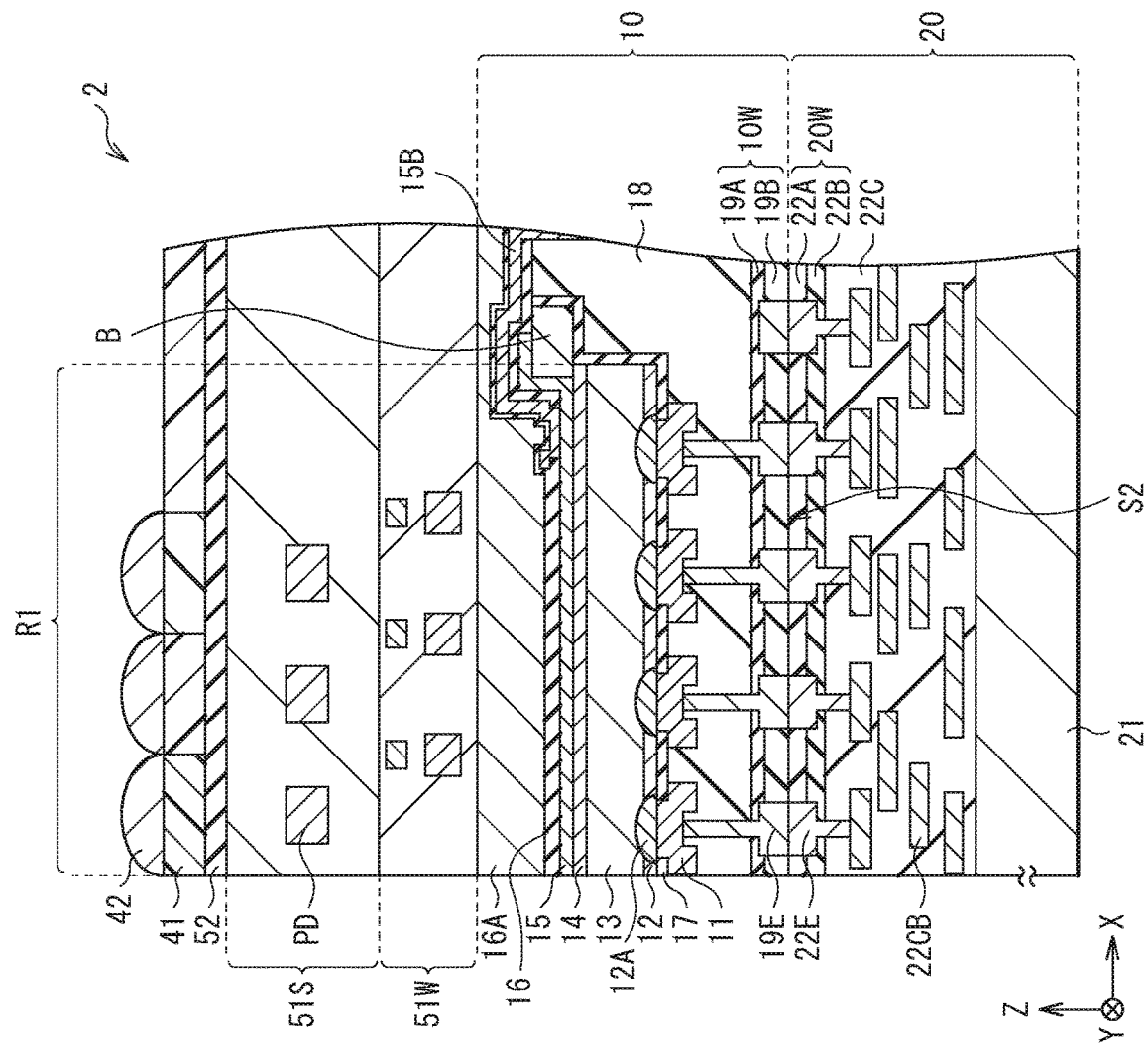
FIG. 26 is a schematic cross-sectional view of an outline configuration of a light-receiving element according to a second embodiment of the present disclosure.

FIG. 26 schematically illustrates a cross-sectional configuration of a light-receiving element (a light-receiving element 2) according to a second embodiment. The light-receiving element 2 has a stacked structure of the element substrate 10 including a compound semiconductor material and a semiconductor layer (a semiconductor layer 51S, a second semiconductor layer) including silicon (Si). Except for this point, the light-receiving element 2 has configurations similar to those of the light-receiving element 1, and workings and effects thereof are also similar. The light-receiving elements 1A and 1B may each include the semiconductor layer 51S.

The light-receiving element 2 includes a wiring layer 51W electrically coupled to the semiconductor layer 51S, the semiconductor layer 51S, the color filter layer 41, and the on-chip lens in this order on the light incident surface S1 of the element substrate 10.

The semiconductor layer 51S is provided with a photodiode PD having p-n junction for each pixel P. The wiring layer 51W includes a plurality of wiring lines; the wiring layer 51W allows, for example, signal charges generated in the photodiode PD to move to the readout circuit substrate 20 for each pixel P.

The light-receiving element 2 performs photoelectric conversion of light beams of wavelengths in, for example, a visible region and an infrared region. For example, the light of a wavelength in a visible region enters the semiconductor layer 51S via the on-chip lens 42 and the color filter layer 41, and is photoelectrically converted in the photodiode PD. Meanwhile, the light of a wavelength in an infrared region is transmitted through the semiconductor layer 51S, and is photoelectrically converted in the photoelectric conversion layer 13 of the element substrate 10. The signal charges generated in the photodiode PD and signal charges generated in the photoelectric conversion layer 13 are read in the readout circuit substrate 20.

In the same manner as described in the above-described light-receiving element 1, the light-receiving element 2 of the present embodiment also forms the embedded layer 18, thus making it possible to suppress the occurrence of a defect in the manufacturing step due to the step difference between the semiconductor layer 10S and the temporary substrate 33. In addition, the semiconductor layer 51S is stacked over the element substrate 10, thus making it possible to perform, in one pixel P, photoelectric conversion of the light beams of wavelengths in a visible region and an infrared region. This makes it possible to increase an amount of information obtainable from the one pixel P.

Application Example 1

The light-receiving element 1 (or the light-receiving element 1A, 1B, 1C, or 2; hereinafter collectively referred to as the light-receiving element 1) described in the foregoing embodiment, etc. is applied to an imaging element, for example. The imaging element is, for example, an infrared image sensor.

Application Example 2

Figure 27:
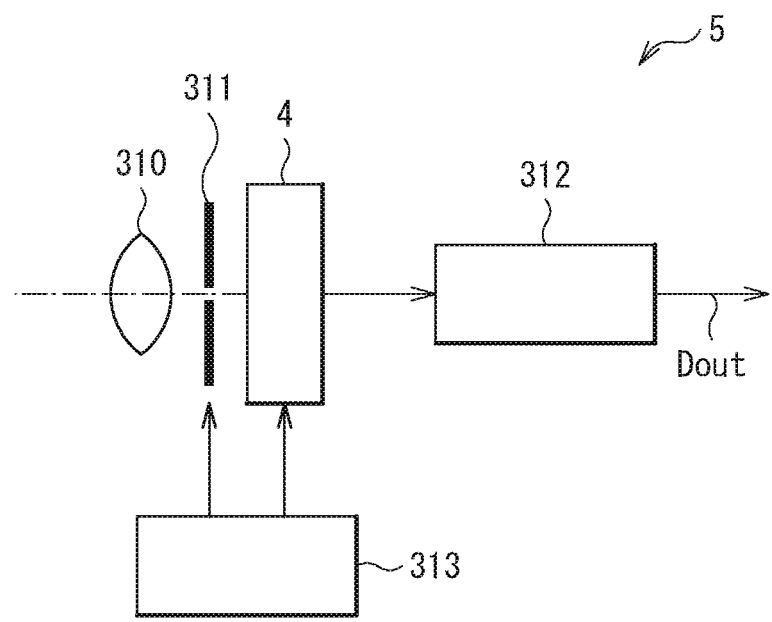
FIG. 27 is a functional block diagram illustrating an example of an electronic apparatus (camera) using an imaging element.

The above-described imaging element is applicable to various types of electronic apparatuses such as a camera that is able to capture an image of an infrared region, for example. FIG. 27 illustrates an outline configuration of an electronic apparatus 5 (camera) as an example thereof. This electronic apparatus 5 is, for example, a camera that is able to photograph a still image or shoot a moving image. The electronic apparatus 5 includes an imaging element 4 constituted by the light-receiving element 1, an optical system (optical lens) 310, a shutter device 311, a drive section 313 that drives the imaging element 4 and the shutter device 311, and a signal processing section 312.

The optical system 310 guides image light (incident light) from a subject to the imaging element 4. The optical system 310 may be constituted by a plurality of optical lenses. The shutter device 311 controls periods of light irradiation and light shielding with respect to the imaging element 4. The drive section 313 controls a transfer operation of the imaging element 4 and a shutter operation of the shutter device 311. The signal processing section 312 performs various types of signal processing on a signal outputted from the imaging element 4. An image signal Dout after the signal processing is stored in a storage medium such as a memory, or outputted to a monitor, etc.

<Example of Practical Application to In-Vivo Information Acquisition System>

Further, the technology according to an embodiment of the present disclosure (present technology) is applicable to various products. For example, the technology according to an embodiment of the present disclosure may be applied to an endoscopic surgery system.

Figure 28:
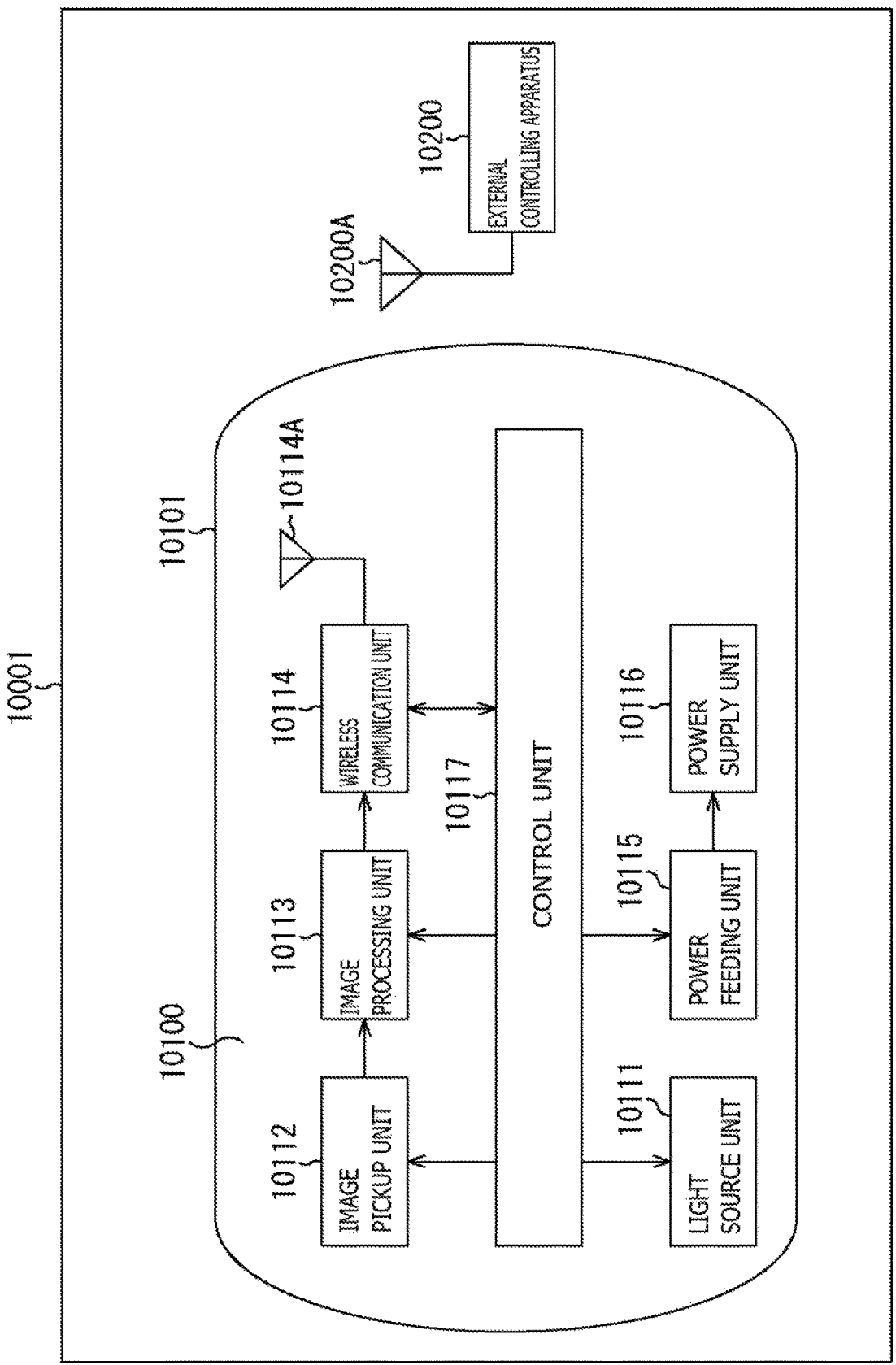
FIG. 28 is a block diagram depicting an example of a schematic configuration of an in-vivo information acquisition system.

FIG. 28 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes the capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 28, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The description has been given above of one example of the in-vivo information acquisition system, to which the technology according to an embodiment of the present disclosure is applicable. The technology according to an embodiment of the present disclosure is applicable to, for example, the image pickup unit 10112 of the configurations described above. This makes it possible to improve detection accuracy.

<Example of Practical Application to Endoscopic Surgery System>

The technology according to an embodiment of the present disclosure (present technology) is applicable to various products. For example, the technology according to an embodiment of the present disclosure may be applied to an endoscopic surgery system.

Figure 29:
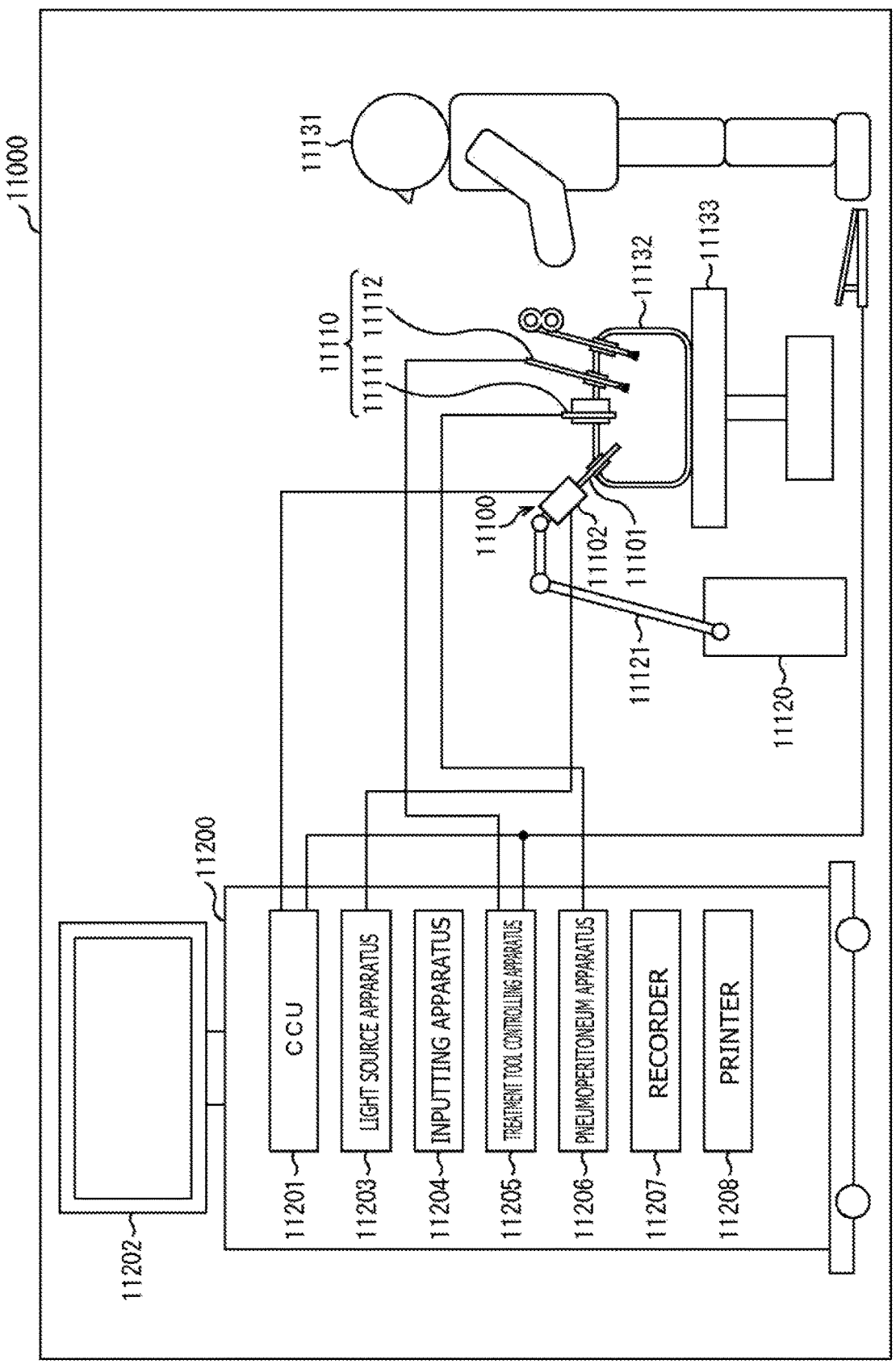
FIG. 29 is a view depicting an example of a schematic configuration of an endoscopic surgery system.

FIG. 29 is a view depicting an example of a schematic configuration of an endoscopic surgery system to which the technology according to an embodiment of the present disclosure (present technology) can be applied.

In FIG. 29, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 30:
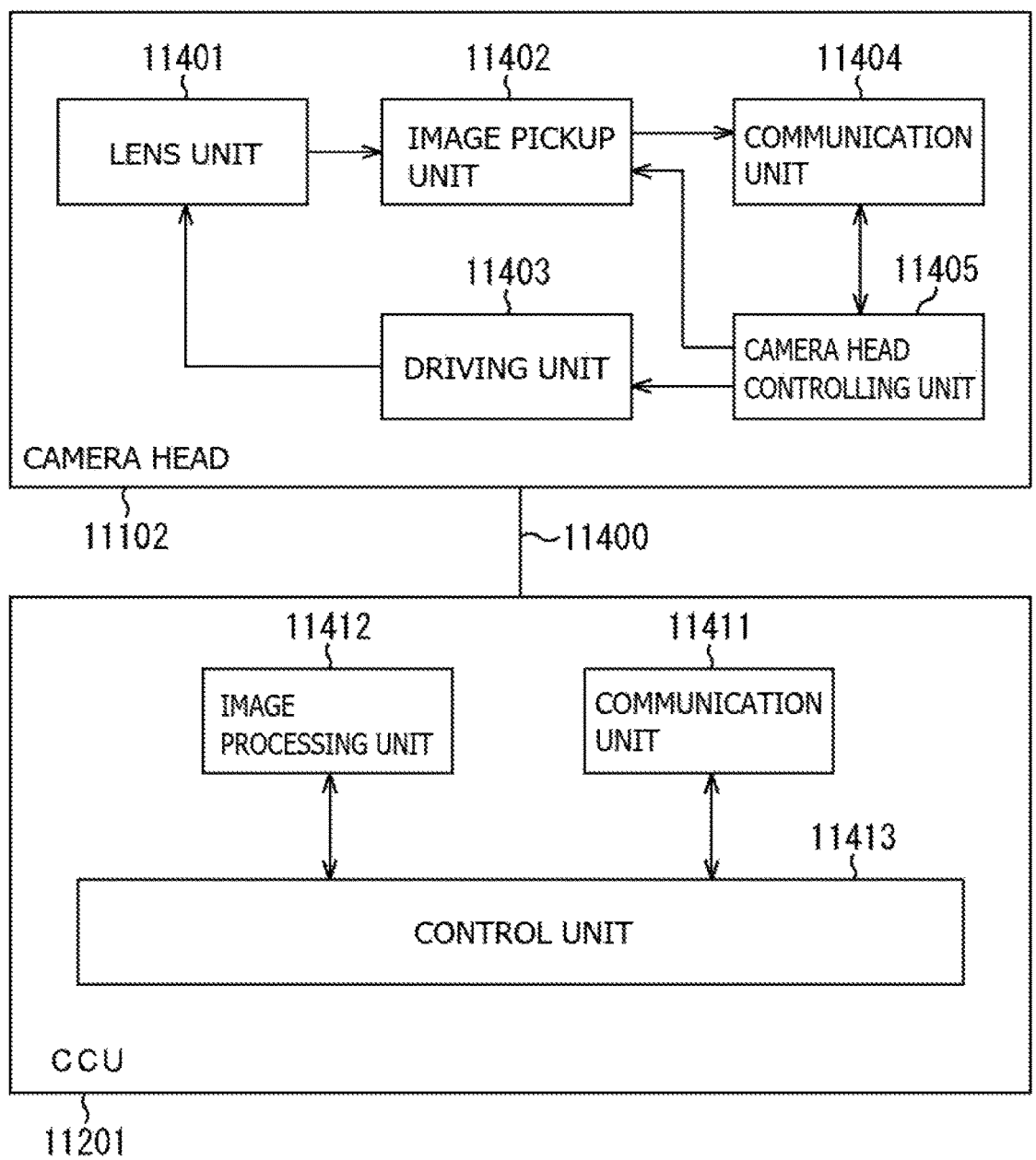
FIG. 30 is a block diagram depicting an example of a functional configuration of a camera head and a camera control unit (CCU).

FIG. 30 is a block diagram depicting an example of a functional configuration of the camera head 11102 and the CCU 11201 depicted in FIG. 29.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to an embodiment of the present disclosure is applicable. The technology according to an embodiment of the present disclosure is applicable to, for example, the image pickup unit 11402 of the configurations described above. Applying the technology according to an embodiment of the present disclosure to the image pickup unit 11402 makes it possible to improve detection accuracy.

It is to be noted that although the endoscopic surgery system has been described as an example here, the technology according to an embodiment of the present disclosure may also be applied to, for example, a microscopic surgery system, and the like.

<Example of Practical Application to Mobile Body>

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, a robot, a construction machine, and an agricultural machine (tractor).

Figure 31:
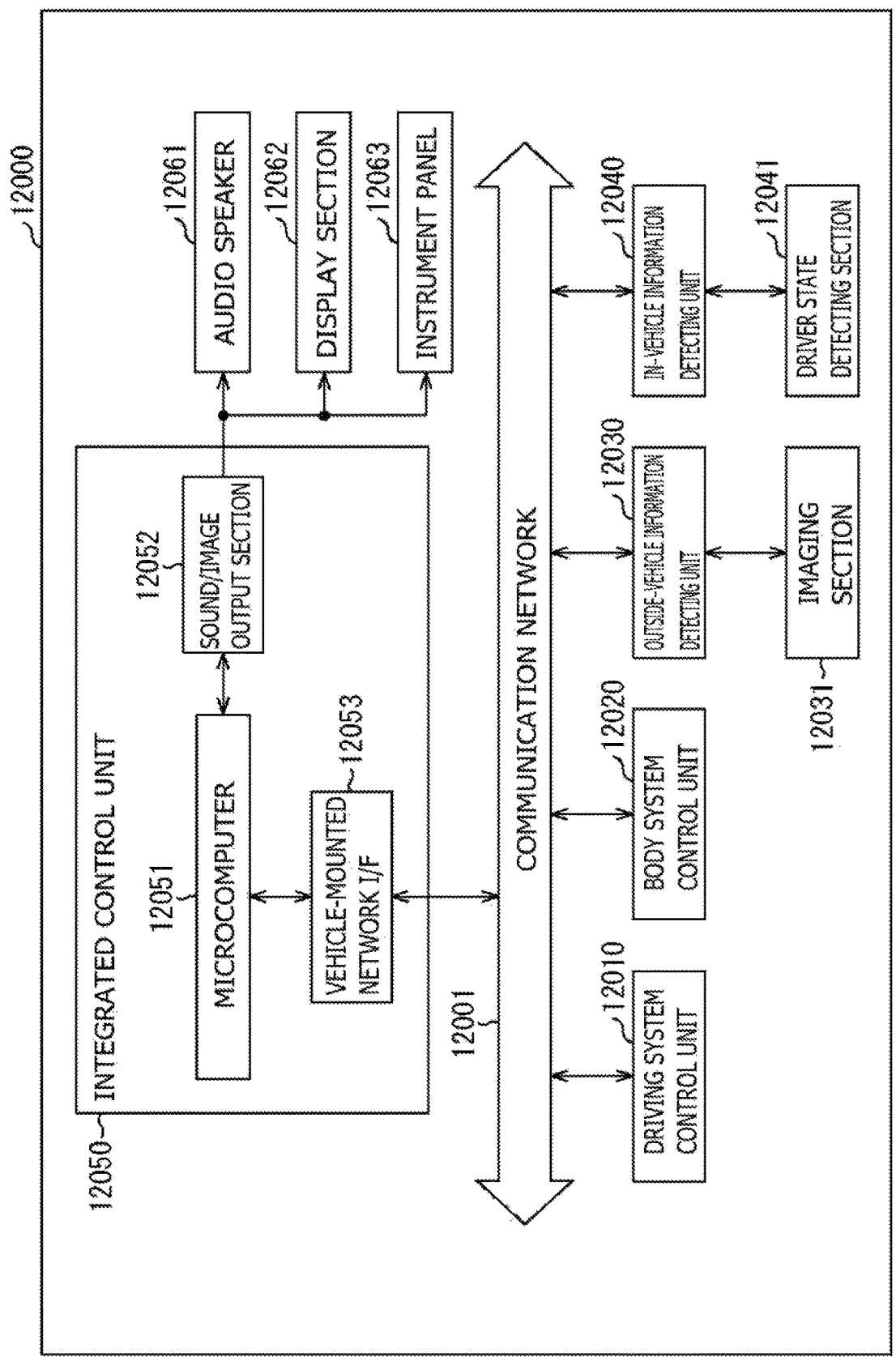
FIG. 31 is a block diagram depicting an example of schematic configuration of a vehicle control system.

FIG. 31 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 31, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 31, an audio speaker 12061, a display section 12062, and an instrument panel 12063 are illustrated as the output device. The display section 12062 may, for example, include at least one of an on-board display and a head-up display.

Figure 32:
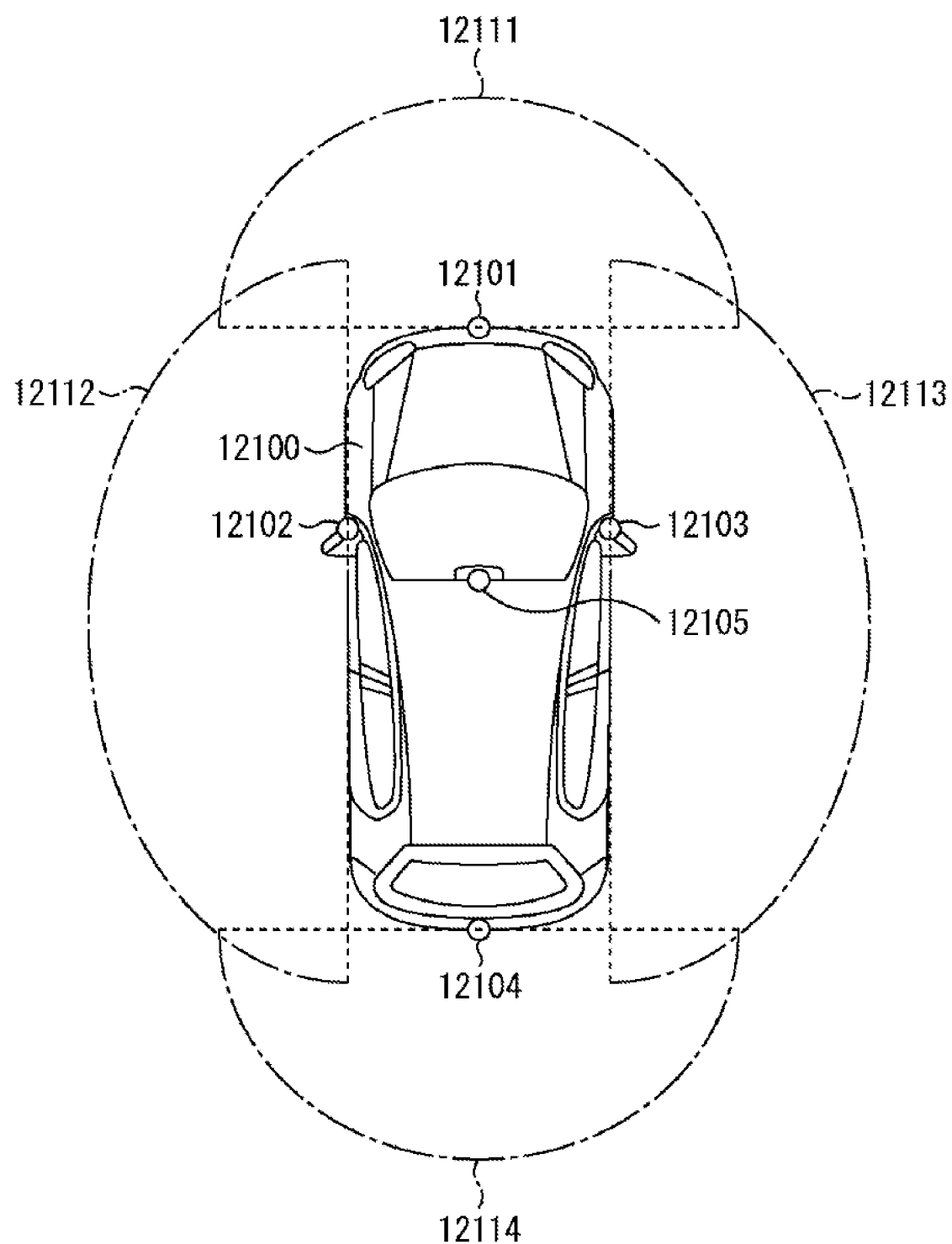
FIG. 32 is a diagram of assistance in explaining an example of installation positions of an outside-vehicle information detecting section and an imaging section.

FIG. 32 is a diagram depicting an example of the installation position of the imaging section 12031.

In FIG. 32, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 32 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of an example of the vehicle control system to which the technology according to an embodiment of the present disclosure may be applied. The technology according to an embodiment of the present disclosure may be applied to the imaging section 12031 out of the configurations described above. Applying the technology according to an embodiment of the present disclosure to the imaging section 12031 makes it possible to obtain a captured image that is easier to see. This makes it possible to decrease fatigue of a driver.

Further, the light-receiving element 1 described in the present embodiment, etc. is applicable to electronic apparatuses such as a surveillance camera, a biometric authentication system, and a thermograph. Examples of the surveillance camera include night vision systems (night scopes). Application of the light-receiving element 1 to the surveillance camera makes it possible to recognize a pedestrian, an animal, and the like at night from a distance. In addition, influences of a headlight and weather are reduced by application of the light-receiving element 1 to a vehicle-mounted camera. For example, it is possible to capture an image by shooting without influences of smoke and fog, for example. Further, it is also possible to recognize a shape of an object. In addition, the thermograph allows for contactless temperature measurement. The thermograph also allows for detection of a temperature distribution and heat generation. Additionally, the light-receiving element 1 is also applicable to electronic apparatuses that detect fire, moisture, gas, or the like.

Although the description has been given by referring to the embodiments and the application examples, the contents of the present disclosure are not limited to the foregoing embodiments, etc., and may be modified in a variety of ways. For example, the layer configuration of the light-receiving element described in the foregoing embodiments is exemplary, and may further include any other layer. In addition, the materials and thicknesses of the respective layers are also exemplary and are not limited to those described above. For example, the description has been given, in the foregoing embodiments, etc., of the case where the first contact layer 12, the photoelectric conversion layer 13, and the second contact layer 14 constitute the semiconductor layer 10S. However, it is sufficient for the semiconductor layer 10S to include the photoelectric conversion layer 13. For example, the first contact layer 12 and the second contact layer 14 may not be provided, or alternatively any other layer may be included.

Further, although the description has been given, in the foregoing embodiments, etc., of the case where the signal charges are holes for the sake of convenience, the signal charges may be electrons. For example, the diffusion region may include n-type impurities.

Additionally, although the description has been given, in the foregoing embodiments, etc., of the light-receiving element of a specific example of the semiconductor element of the present technology, the semiconductor element of the present technology may be other than the light-receiving element. For example, the semiconductor element of the present technology may be a light-emitting element.

In addition, the effects described in the foregoing embodiments, etc. are merely exemplary, and may be other effects or may further include other effects.

It is to be noted that the present disclosure may have the following configurations. According to the semiconductor element and the manufacturing method thereof of the present disclosure having the following configurations, the first passivation film and the second passivation film opposed to each other with the (first) semiconductor layer in between are provided, thus making it possible to effectively protect the semiconductor layer. This makes it possible to protect a compound semiconductor material and thus to suppress lowering in reliability.

(1)

A semiconductor element including:
an element substrate provided with an element region at a middle part and a peripheral region outside the element region; and
a readout circuit substrate facing the element substrate,
the element substrate including
 a first semiconductor layer provided in the element region and including a compound semiconductor material,
 a wiring layer provided between the first semiconductor layer and the readout circuit substrate, the wiring layer electrically coupling the first semiconductor layer and the readout circuit substrate to each other,
 a first passivation film provided between the wiring layer and the first semiconductor layer, and
 a second passivation film opposed to the first passivation film with the first semiconductor layer interposed therebetween,
the peripheral region of the element substrate including a bonded surface with respect to the readout circuit substrate.

(2)

The semiconductor element according to (1), in which the element substrate further includes
 an embedded layer provided at least in the peripheral region and surrounding the first semiconductor layer, and
 a third passivation film provided between the embedded layer and the first semiconductor layer.

(3)

The semiconductor element according to (2), in which the third passivation film and the first passivation film are provided continuously.

(4)
The semiconductor element according to (2), in which the third passivation film is in contact with the first passivation film.
(5)
The semiconductor element according to any one of (2) to (4), in which
the embedded layer includes
a first embedded layer, and
a second embedded layer provided between the first embedded layer and the readout circuit substrate and between the first semiconductor layer and the wiring layer.
(6)
The semiconductor element according to (5), in which the first passivation film extends across the element region and the peripheral region, and is provided between the first embedded layer and the second embedded layer.
(7)
The semiconductor element according to any one of (1) to (6), in which
the element substrate further includes
a first electrode provided between the first semiconductor layer and the wiring layer and being electrically coupled to the first semiconductor layer, and
a second electrode opposed to the first electrode with the first semiconductor layer interposed therebetween.
(8)
The semiconductor element according to (7), in which the first electrode is provided between the first passivation film and the first semiconductor layer.
(9)
The semiconductor element according to (7), in which the first passivation film has an opening in which the first electrode is buried.
(10)
The semiconductor element according to (2), in which the element substrate further includes, in the peripheral region, a coupling part that electrically couples the second electrode and the readout circuit substrate to each other.
(11)
The semiconductor element according to (10), in which
the coupling part is constituted by a groove provided in the embedded layer, and
the groove is provided to surround the element region.
(12)
The semiconductor element according to any one of (1) to (11), in which the element region of the element substrate is bonded to the readout circuit substrate on a plane identical to the bonded surface of the peripheral region.
(13)
The semiconductor element according to any one of (1) to (12), in which the wiring layer is provided also in the peripheral region.
(14)
The semiconductor element according to any one of (1) to (13), in which the compound semiconductor material absorbs light of a wavelength in an infrared region.
(15)
The semiconductor element according to any one of (1) to (14), in which the compound semiconductor material includes one of indium gallium arsenide, indium arsenide antimonide, indium arsenide, indium antimonide, and mercury cadmium tellurium.

(16)
The semiconductor element according to any one of (1) to (15), further including an on-chip lens on side of a surface opposite to a surface, of the first semiconductor layer, opposed to the readout circuit substrate.
(17)
The semiconductor element according to any one of (1) to (16), further including a second semiconductor layer provided to be stacked over the element substrate, the second semiconductor layer including a photodiode.
(18)
A method of manufacturing a semiconductor element, the method including:
forming a semiconductor layer including a compound semiconductor material;
bonding the semiconductor layer to a temporary substrate;
forming a first passivation film covering the semiconductor layer after the bonding of the semiconductor layer to the temporary substrate;
forming an embedded layer that fills a step difference between the semiconductor layer and the temporary substrate;
forming a wiring layer over a surface opposite to a bonded surface of the semiconductor layer with respect to the temporary substrate;
causing a readout circuit substrate to be opposed to the semiconductor layer with the wiring layer interposed therebetween to electrically couple the semiconductor layer and the readout circuit substrate to each other via the wiring layer; and
forming a second passivation film opposed to the first passivation film with the semiconductor layer interposed therebetween after removal of the temporary substrate bonded to the semiconductor layer.
(19)
The method of manufacturing the semiconductor element according to (18), the method further including:
forming a plurality of openings in the first passivation film; and
burying a first electrode in each of the plurality of openings.
(20)
The method of manufacturing the semiconductor element according to (18), the method further including forming a first electrode electrically coupled to the semiconductor layer, in which the first passivation film is formed after the formation of the first electrode.

This application claims the benefit of Japanese Priority Patent Application JP2018-195110 filed with the Japan Patent Office on Oct. 16, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A semiconductor element, comprising:
an element substrate that comprises with an element region at a middle part and a peripheral region outside the element region; and
a readout circuit substrate that faces the element substrate, wherein the element substrate includes:
a first semiconductor layer in the element region, wherein the first semiconductor layer includes a compound semiconductor material;

a wiring layer between the first semiconductor layer and the readout circuit substrate, wherein the wiring layer electrically couples the first semiconductor layer with the readout circuit substrate;

a first passivation film between the wiring layer and the first semiconductor layer;

a second passivation film opposite to the first passivation film with the first semiconductor layer interposed therebetween;

an embedded layer at least in the peripheral region and surrounding the first semiconductor layer, wherein the embedded layer includes
a first embedded layer, and
a second embedded layer between the first embedded layer and the readout circuit substrate and between the first semiconductor layer and the wiring layer; and a third passivation film between the embedded layer and the first semiconductor layer, wherein the peripheral region of the element substrate includes a bonded surface with respect to the readout circuit substrate.

2. The semiconductor element according to claim 1, wherein the third passivation film is continuous with the first passivation film.

3. The semiconductor element according to claim 1, wherein the third passivation film is in contact with the first passivation film.

4. The semiconductor element according to claim 1, wherein the first passivation film extends across the element region and the peripheral region, and is between the first embedded layer and the second embedded layer.

5. The semiconductor element according to claim 1, wherein the element substrate further includes:
a first electrode between the first semiconductor layer and the wiring layer and is electrically coupled to the first semiconductor layer, and
a second electrode opposite to the first electrode with the first semiconductor layer interposed therebetween.

6. The semiconductor element according to claim 5, wherein the first electrode is between the first passivation film and the first semiconductor layer.

7. The semiconductor element according to claim 5, wherein the first passivation film has an opening in which the first electrode is buried.

8. The semiconductor element according to claim 1, wherein the element substrate further includes, in the peripheral region, a coupling part configured to electrically couple the second electrode and the readout circuit substrate to each other.

9. The semiconductor element according to claim 8, wherein
the coupling part is constituted by a groove in the embedded layer, and
the groove surrounds the element region.

10. The semiconductor element according to claim 1, wherein the element region of the element substrate is bonded to the readout circuit substrate on a plane identical to the bonded surface of the peripheral region.

11. The semiconductor element according to claim 1, wherein the wiring layer is in the peripheral region.

12. The semiconductor element according to claim 1, wherein the compound semiconductor material absorbs light of a wavelength in an infrared region.

13. The semiconductor element according to claim 1, wherein the compound semiconductor material comprises one of indium gallium arsenide, indium arsenide antimonide, indium arsenide, indium antimonide, or mercury cadmium tellurium.

14. The semiconductor element according to claim 1, further comprising an on-chip lens on side of a surface opposite to a surface, of the first semiconductor layer, opposed to the readout circuit substrate.

15. The semiconductor element according to claim 1, further comprising a second semiconductor layer stacked over the element substrate, wherein the second semiconductor layer includes a photodiode.

* * * * *